United States Patent
Hotra et al.

(10) Patent No.: US 10,389,458 B2
(45) Date of Patent: Aug. 20, 2019

(54) METHOD AND APPARATUS FOR TESTING RF PERFORMANCE OF A SATELLITE WIRING HARNESS AND SIGNAL PROCESSING UNITS

(71) Applicant: THE BOEING COMPANY, Chicago, IL (US)

(72) Inventors: Jonathan N. Hotra, St. Louis, MO (US); Villy Angelico, El Segundo, CA (US); Timothy J. Dale, Berkeley, MA (US); Rachel Ertl, Madison, AL (US); Kevin Grider, St. Charles, MO (US); John L. Henroid, St. Louis, MO (US); Steve A. Kern, St. Louis, MO (US); William Krekeler, St. Louis, MO (US); Randall J. Krohn, Berkeley, MO (US); Kenn R. Luecke, Berkeley, MO (US); Roland Mah, El Segundo, CA (US); Jill McLean, Whitesboro, NY (US); Paul Murray, Huntsville, AL (US); Stephen L. Oliver, Jr., El Segundo, CA (US); Albert Portillo, El Segundo, CA (US); E. Manow Seapoe, Jr., Hazelwood, MO (US); Craig Sowadski, Berkeley, MO (US); Bradley J. Trapp, Berkeley, MO (US)

(73) Assignee: The Boeing Company, Chicago, IL (US)

( * ) Notice: Subject to any disclaimer, the term of this patent is extended or adjusted under 35 U.S.C. 154(b) by 239 days.

(21) Appl. No.: 15/469,084

(22) Filed: Mar. 24, 2017

(65) Prior Publication Data
US 2018/0276331 A1 Sep. 27, 2018

(51) Int. Cl.
*H04B 17/391* (2015.01)
*G09B 23/18* (2006.01)
(Continued)

(52) U.S. Cl.
CPC ..... *H04B 17/3912* (2015.01); *G06F 17/5095* (2013.01); *G09B 23/181* (2013.01); *H04B 17/0085* (2013.01)

(58) Field of Classification Search
CPC ............ G06F 17/5095; H04B 17/3912; G09B 23/181
See application file for complete search history.

(56) References Cited

U.S. PATENT DOCUMENTS

| | | | |
|---|---|---|---|
| 6,256,602 B1 * | 7/2001 | Ellis .......................... | G09B 9/00 701/13 |
| 7,620,537 B2 * | 11/2009 | Johnson ................... | G09B 9/00 703/22 |

(Continued)

OTHER PUBLICATIONS

Ahmad, A. H. and S. M. Mohsen, Simulation of Satellite Telemetry-Telecommand Coherent Transponder, Journal of Engineering and Development, vol. 11, No. 2, Sep. 2007, pp. 46-68 (Year: 2007).*

*Primary Examiner* — Jay Hann
(74) *Attorney, Agent, or Firm* — Womble Bond Dickinson (US) LLP

(57) ABSTRACT

A method of testing a design of a satellite payload transponder with modules of radio frequency (RF) communications circuitry includes executing a modeling application for establishing a modeling environment for generating a virtual satellite payload transponder and virtual test equipment. The virtual satellite payload transponder has virtual modules of RF communications circuitry, with functionality equivalent to that of the satellite payload transponder with modules of RF communications circuitry. The virtual test equipment has functionality equivalent to that of physical test equipment in conjunction with modular test system software. The modeling environment establishes an executable block diagram for performing a simulation of executed satellite payload transponder command, RF signal performance and telemetry (Continued)

response testing, utilizing a given version of the modular test system software corresponding to the modules of RF communications circuitry of the design of the satellite payload transponder.

27 Claims, 13 Drawing Sheets

(51) Int. Cl.
*H04B 17/00* (2015.01)
*G06F 17/50* (2006.01)

(56) References Cited

U.S. PATENT DOCUMENTS

| | | | |
|---|---|---|---|
| 8,145,966 B2* | 3/2012 | Roblett | H04L 43/50 455/226.1 |
| 8,615,384 B2 | 12/2013 | Angus et al. | |
| 8,911,236 B2* | 12/2014 | Gasco Nunez | G09B 9/05 244/135 A |
| 9,262,939 B2 | 2/2016 | Lechner | |
| 9,641,238 B1* | 5/2017 | Coleman | H04B 7/18519 |
| 9,839,103 B2* | 12/2017 | Avrahamy | C02F 1/42 |
| 9,954,601 B2* | 4/2018 | Buer | H04B 7/18534 |
| 2008/0204333 A1* | 8/2008 | Lamothe | G06K 19/0701 343/703 |
| 2015/0032297 A1* | 1/2015 | Loewen | B64F 5/60 701/3 |
| 2015/0227647 A1* | 8/2015 | Shelton | G06F 17/5009 703/13 |

* cited by examiner

A COMPONENT HAS...
> "ACTIVE" OR "INACTIVE" STATE
> PORTS
> EXTERNAL CONNECTIONS TO PORTS
> INTERNAL CONNECTION BETWEEN PORTS

METHOD AND APPARATUS FOR TESTING RF PERFORMANCE OF A SATELLITE WIRING HARNESS AND SIGNAL PROCESSING UNITS

TECHNOLOGICAL FIELD

The present disclosure relates generally to satellite communications systems and, in particular, to satellite design and manufacturing.

BACKGROUND

Satellites are used in a variety of diverse fields such as for navigation, communication, environmental monitoring, weather forecasting, broadcasting and the like. Many homes, businesses, government organizations and other users may use satellites on a daily basis for entertainment, communication, information gathering and other purposes. Hundreds of man-made satellites now orbit the earth, and more are launched each year.

A typical modern satellite may include a metal or composite frame that carries one or more antennas, power sources such as solar cells and batteries, and various electronic components including modules of communications circuitry implemented by satellite payload transponders. These modules are numerous and may include telemetry and command modules, and modules of radio frequency (RF) communications circuitry including telemetry and command functionality that are respectively monitored and commanded by the telemetry modules and command modules. The telemetry and command modules are often connected to the modules of RF communications circuitry by wiring harnesses, and modules of RF communications circuitry are often interconnected by RF links.

The design and manufacture of a satellite often includes payload design, and a payload test program to validate and verify the payload design. Payload design currently includes calculation of integrated payload performance predictions based on unit design performance predictions. The nature of predictions forces payload engineers to design in conservatism to ensure actual end item performance. This conservatism has often forced the satellite to be larger than needed for power, size, weight, and unit redundancy—all of which are direct cost drivers to the overall program costs and affordability.

In order to define a payload test program, there needs to be a design. During proposal or even program baseline, the design is more conceptual with numerous assumptions on the design results. Because of the lack of design definition, the test program is based on assumptions that are not valid resulting in unidentified impacts to testability, test complexity, test scope, test software and Special Test Equipment (STE) capability. This is a direct source of recurring cost and schedule overruns on programs.

For payload test program validation, the only available satellite representation is the Dynamic Space Simulator (DSS), which is a program contractual deliverable and cannot be developed until the satellite design is complete. The DSS fidelity is focused on the satellite bus platform because the DSS purpose is for mission operations use. There is only rudimentary payload representation sufficient to determine if payload units are operational or not, nothing else. Therefore, any payload test procedure validation is limited by what is currently provided by the DSS, which is less than what is needed for spacecraft systems test.

Therefore it would be desirable to have a system and method that takes into account at least some of the issues discussed above, as well as other possible issues.

BRIEF SUMMARY

Example implementations of the present disclosure provide a system, and corresponding method and computer-readable storage medium for testing designs of communications circuitry such as a design of a satellite payload transponder with modules of RF communications circuitry including telemetry and command functionality. In some examples, the system is implemented by an executable block diagram (EBD) that provides a tool to help the front-end of design in order to help the back-end in test by enabling the early definition of test requirements and testability via a customizable virtual payload that provides high fidelity payload performance based on actual unit performance. In some example implementations, the virtual payload is assembled by connecting payload unit templates that are architected to receive existing unit data. Once the virtual payload is constructed, it can be stimulated with a desired uplink signal via virtualized special test equipment (STE) and payload performance can be collected based on the integrated unit data. Test requirements can be developed, test cases can be extracted, testability can be determined real time, impacts to STE capability can be demonstrated, and new tests can be evaluated during proposal. Reusing the EBD into payload detail design will allow test engineering to identify risks and issues that need to be addressed in the design as the payload is being developed instead of after the design is complete and not much can be done.

Some example implementations provide a method of testing a design of a satellite payload transponder with modules of RF communications circuitry including telemetry and command functionality, the method comprising storing in memory a database of command inputs; and executing a modeling application, via a processor configured to access the database of command inputs, for establishing a modeling environment for generating: a virtual satellite payload transponder with virtual modules of RF communications circuitry including telemetry and command functionality, with functionality equivalent to that of the satellite payload transponder with modules of RF communications circuitry including the telemetry and command functionality, where the functionality is configured according to command input from the database and includes generating a particular RF signal performance and telemetry response to a given RF waveform stimulus and configuration of the satellite payload transponder; and virtual test equipment with functionality equivalent to that of physical test equipment in conjunction with modular test system software, the virtual test equipment including virtual RF uplink and downlink signal components with functionality equivalent to that of physical test equipment RF uplink and downlink signal components, the virtual RF uplink and downlink signal components including one or more of each of: a virtual RF waveform generator with functionality equivalent to that of a physical RF waveform generator, and for generating a simulation of an RF waveform stimulus; a virtual power sensor with functionality equivalent to that of a physical power sensor, and for analyzing the generated simulation of the RF waveform stimulus; and a virtual signal analyzer with functionality equivalent to that of a physical signal analyzer, and for analyzing RF signal performance to the generated simulation of the RF waveform stimulus, wherein the modeling environment establishes an executable block diagram for performing a simulation of executed satellite payload transponder command, RF signal performance and telemetry response testing, utilizing a given version of the modular test system software corresponding to the modules of RF communications circuitry including the telemetry and command functionality of the design of the satellite payload transponder.

In some example implementations of the method of any preceding or any subsequent example implementation, or any combination thereof, executing the modeling application includes executing the modeling application for establishing the modeling environment for further generating a virtual Ethernet layer network for transmission of the executed satellite payload transponder command, RF signal performance and telemetry response.

In some example implementations of the method of any preceding or any subsequent example implementation, or any combination thereof, the method further comprises executing the executable block diagram to perform the simulation of the executed satellite payload transponder command, RF signal performance and telemetry response testing to test the design of the satellite payload transponder with the modules of RF communications circuitry including the telemetry and command functionality, and to generate a test result.

In some example implementations of the method of any preceding or any subsequent example implementation, or any combination thereof, executing the executable block diagram includes executing the executable block diagram to perform the simulation utilizing operating characteristics of the virtual test equipment.

In some example implementations of the method of any preceding or any subsequent example implementation, or any combination thereof, executing the executable block diagram to perform simulation of the executed satellite payload transponder command, RF signal performance and telemetry response testing includes generating, by the virtual modules of RF communications circuitry, a DC power consumption level output associated with the generated simulation of the RF waveform stimulus and configuration of the satellite payload transponder.

In some example implementations of the method of any preceding or any subsequent example implementation, or any combination thereof, the method further comprises characterizing the design of the satellite payload transponder based on the test result; and validating the design of the satellite payload transponder based on the characterization.

In some example implementations of the method of any preceding or any subsequent example implementation, or any combination thereof, in an instance in which the design of the satellite payload transponder is validated, the method further comprises identifying design requirements for the satellite payload transponder based on the test result; and exporting the design requirements into requirement specifications for production of the satellite payload transponder with the modules of RF communications circuitry including the telemetry and command functionality according thereto.

In some example implementations of the method of any preceding or any subsequent example implementation, or any combination thereof, the method further comprises transmitting data packets to a visualization tool configured to output a graphic depiction of the virtual satellite payload transponder with the virtual modules of RF communications circuitry including the telemetry and command functionality.

In some example implementations of the method of any preceding or any subsequent example implementation, or any combination thereof, the visualization tool produces the graphic depiction of the virtual satellite payload transponder from a source drawing that includes elements from a stencil library containing or referencing related operating characteristics.

Some example implementations provide an apparatus for testing a design of a satellite payload transponder with modules of RF communications circuitry including telemetry and command functionality. The apparatus comprises a processor and a memory storing executable instructions that, in response to execution by the processor, cause the apparatus to at least perform the method of any preceding example implementation, or any combination thereof.

Some example implementations provide a computer readable storage medium for testing a design of a satellite payload transponder with modules of RF communications circuitry including telemetry and command functionality. The computer-readable storage medium is non-transitory and having computer-readable program code portions stored therein that, in response to execution by a processor, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
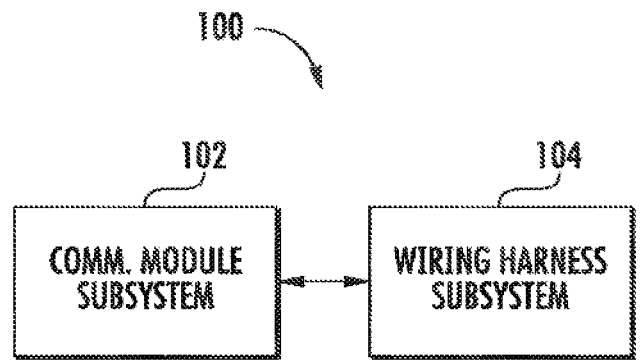
FIG. 1 illustrates a system according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference to something as being a first, second or the like should not be construed to imply a particular order. Also, for example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

Example implementations of the present disclosure are directed to testing designs of communications circuitry such as a design of a satellite payload transponder with modules of RF communications circuitry including telemetry and command functionality, and testing designs of wiring harnesses such as those designed for a satellite.

Satellites and a number of other complex electrical and electromechanical systems are composed of electronics including modules of communications circuitry implemented by satellite payload transponders. These modules are numerous and may include telemetry and command modules and the like, and modules of RF communications circuitry including telemetry and command functionality that are respectively monitored and commanded by the telemetry modules and command modules. Examples of suitable telemetry and command modules include remote telemetry and command unit (RTCU), embedded telemetry module (ETM), embedded command module (ECM), central telemetry and command unit (CTCU) and the like. The telemetry and command modules are often connected to the modules of RF communications circuitry by wiring harnesses, and modules of RF communications circuitry are often interconnected by RF links. Example implementations of the present disclosure provide a system for testing designs of electrical, electromechanical and RF communication systems such as satellites.

FIG. 1 illustrates a system 100 according to example implementations of the present disclosure. The system is configured to perform a number of different functions or operations, either automatically, under direct operator control, or some combination of thereof. In this regard, in some examples, the system is configured to perform one or more of its functions or operations automatically, that is, without being directly controlled by an operator. Additionally or alternatively, in some examples, the system is configured to perform one or more of its functions or operations under direct operator control.

The system 100 includes one or more of each of any of a number of different subsystems (each an individual system) for performing one or more of its functions or operations. In some examples, the system includes a communications module subsystem 102 and a wiring harness subsystem 104 coupled to one another. Although being shown together as part of the system, it should be understood that either of the subsystems may function or operate as a separate system without regard to the other. And further, it should be understood that the system may include one or more additional or alternative subsystems than those shown in FIG. 1.

The wiring harness subsystem 104 is generally configured to test designs of wiring harnesses such as those designed for a satellite. More information regarding the communications module is provided in U.S. patent application Ser. No. 15/469,137, entitled: Method and Apparatus for Testing Design of Satellite Wiring Harness and Signal Processing Units, filed concurrently herewith, the content of which is incorporated herein by reference.

Figure 2:
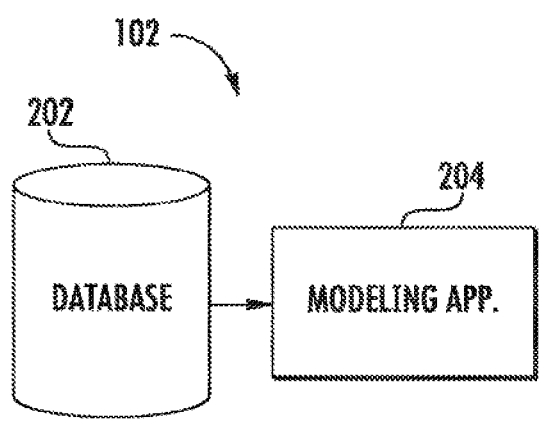
FIG. 2 illustrates a communications module subsystem of the system of FIG. 1, according to some example implementations.

The communications module subsystem 102 is generally configured to test designs of communications circuitry such as a design of a satellite payload transponder with modules of RF communications circuitry including telemetry and command functionality. FIG. 2 more particularly illustrates the communications module subsystem according to some example implementations of the present disclosure. The communications module subsystem includes one or more of each of any of a number of different sub-subsystems (each an individual system or subsystem) for performing one or more of its functions or operations. As shown, in some examples, the communications module subsystem includes a database of command inputs 202, and a modeling application 204. Although being shown together as part of the system, it should be understood that either of the sub-subsystems may function or operate as a separate system or subsystem without regard to the other. And further, it should be understood that the communications module subsystem may include one or more additional or alternative sub-subsystems than those shown in FIG. 2.

Figure 3:
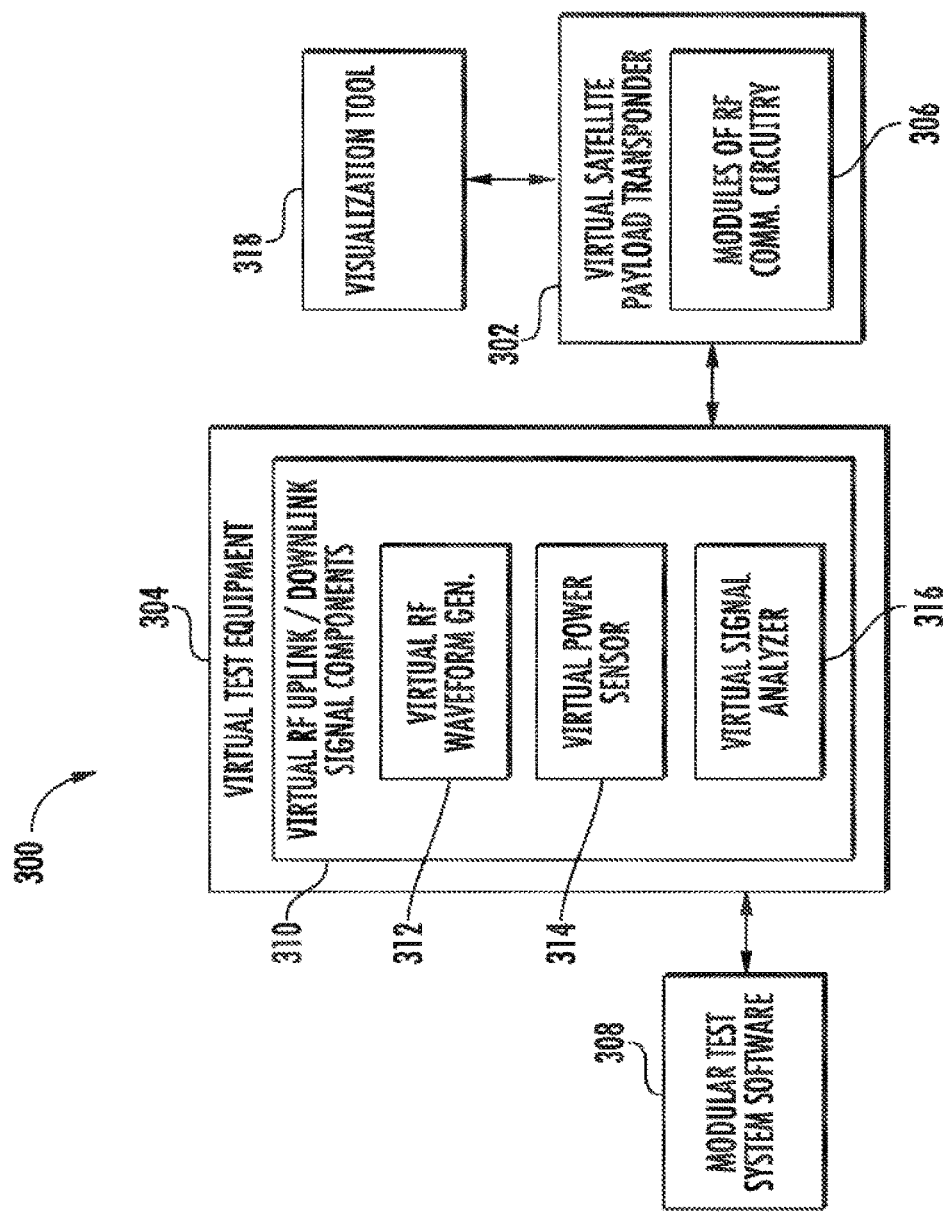
FIG. 3 illustrates an executable block diagram (EBD) established by a modeling environment established by a modeling application of the communications module subsystem of FIG. 2, according to example implementations.

According to example implementations, the modeling application 204 is executable via a processor configured to access the database of command inputs 202, for establishing a modeling environment for generating a virtual satellite payload transponder and virtual test equipment. This modeling environment in turn establishes an executable block diagram (EBD) for performing simulations. FIG. 3 illustrates an EBD 300 according to some examples, including the virtual satellite payload transponder 302 and virtual test equipment 304.

The virtual satellite payload transponder 302 has virtual modules of RF communications circuitry 306 including telemetry and command functionality. The virtual modules have functionality equivalent to that of the satellite payload transponder with modules of RF communications circuitry including the telemetry and command functionality. And the functionality is configured according to command input from the database 202 and includes generating a particular RF signal performance and telemetry response to a given RF waveform stimulus and configuration of the satellite payload transponder. In some examples, the command inputs can configure the virtual satellite payload transponder state and/or the virtual test equipment state. The RF waveform stimulus may be configured by command inputs to the virtual test equipment in order to supply a virtual RF stimulus that is compliant with the signal processing capability of the satellite payload transponder.

The virtual test equipment 304 has functionality equivalent to that of physical test equipment in conjunction with modular test system software 308. The virtual test equipment includes virtual RF uplink and downlink signal components 310 with functionality equivalent to that of physical test equipment RF uplink and downlink signal components. As shown, the virtual RF uplink and downlink signal components minimally include a virtual RF waveform generator 312, a virtual power sensor 314 and a virtual signal analyzer 316. The virtual RF waveform generator has functionality equivalent to that of a physical RF waveform generator, and for generating a simulation of an RF waveform stimulus. The virtual power sensor has functionality equivalent to that of a physical power sensor, and for analyzing the generated simulation of the RF waveform stimulus. The virtual signal analyzer has functionality equivalent to that of a physical signal analyzer, and for analyzing RF signal performance to the generated simulation of the RF waveform stimulus.

According to example implementations, the modeling environment establishes the executable block diagram 300 for performing a simulation of executed satellite payload transponder command, RF signal performance and telemetry response testing. This simulation is performed utilizing a given version of the modular test system software 308 corresponding to the modules of RF communications circuitry including the telemetry and command functionality of the design of the satellite payload transponder. In some examples, the modeling application 204 is executed for further generating a virtual Ethernet layer network for transmission of the executed satellite payload transponder command, RF signal performance and telemetry response.

In some examples, the EBD 300 is executed to perform the simulation of the executed satellite payload transponder command, RF signal performance and telemetry response testing to test the design of the satellite payload transponder with the modules of RF communications circuitry including the telemetry and command functionality, and to generate a test result. In some of these examples, this includes the EBD being executed to generate, by the virtual modules of RF communications circuitry 306, a DC power consumption level output associated with the generated simulation of the RF waveform stimulus and configuration of the satellite payload transponder.

In some examples, the modeling application 204 is further to characterize the design of the satellite payload transponder based on the test result, and validate the design of the satellite payload transponder based on the characterization. In some of these examples, in an instance in which the design of the satellite payload transponder is validated, the modeling application 204 is further to identify design requirements for the satellite payload transponder based on the test result, and export the design requirements into requirement specifications for production of the satellite payload transponder with the modules of RF communications circuitry including the telemetry and command functionality according thereto.

In some examples, the EBD 300 further includes a visualization tool 318. In some of these examples, the modeling application 204 is to further transmit data packets to the visualization tool configured to output a graphic depiction of the virtual satellite payload transponder 302 with the virtual modules of RF communications circuitry 306 including the telemetry and command functionality.

Figure 4:
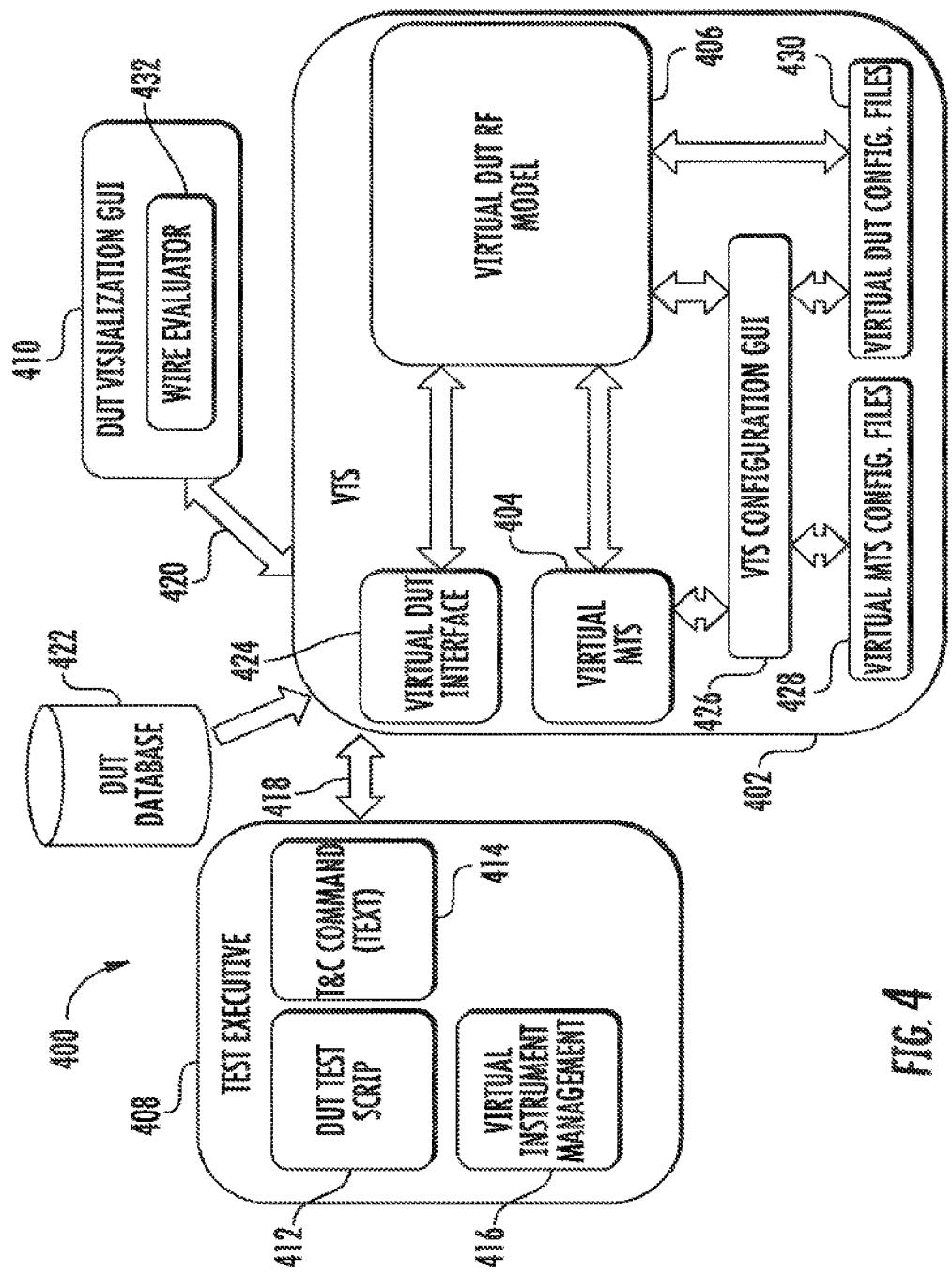
FIGS. 4, 5 and 6 illustrate an EBD that corresponds to the EBD of FIG. 3 in some example implementations.
Figure 5:
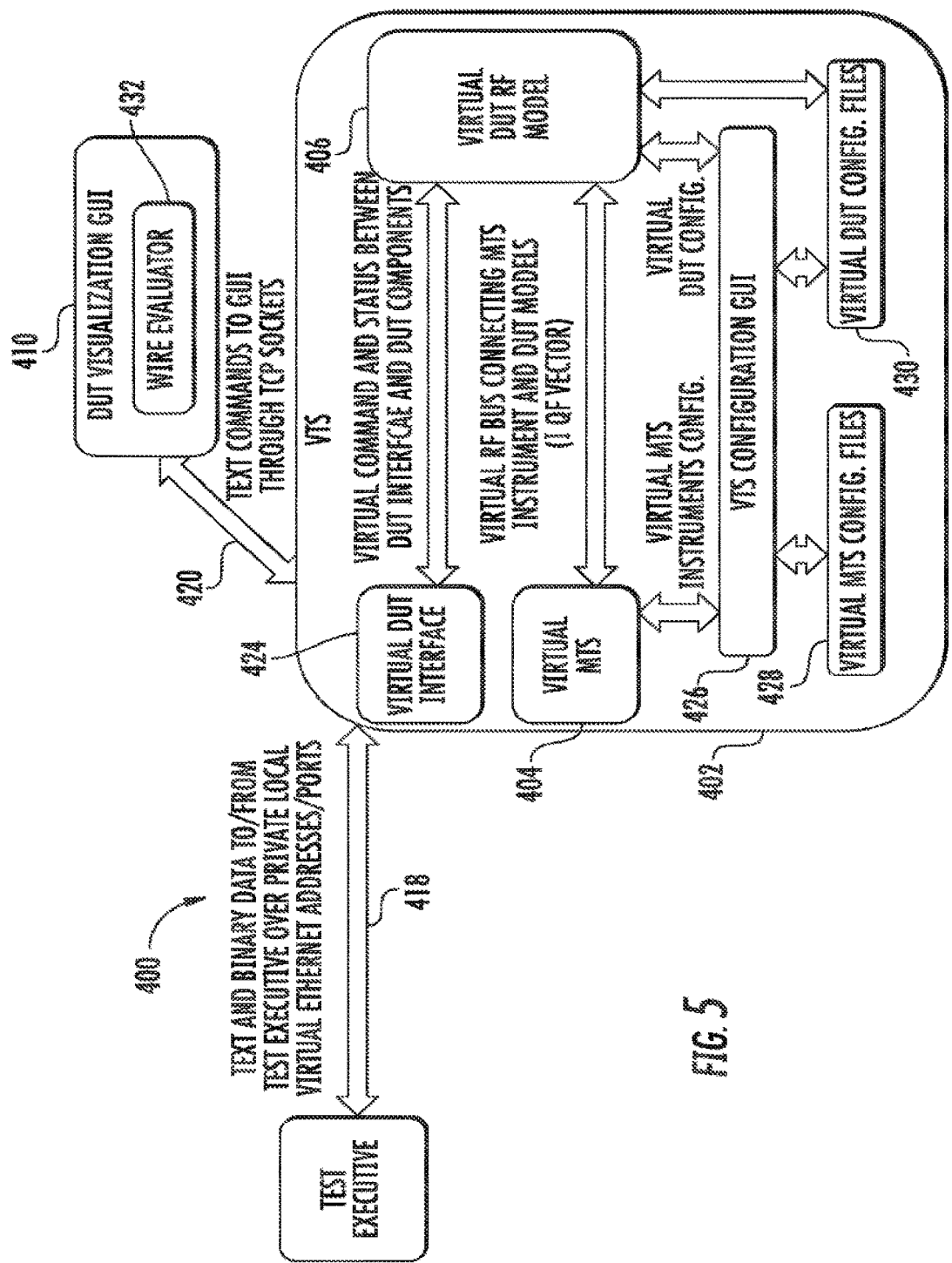
Figure 6:
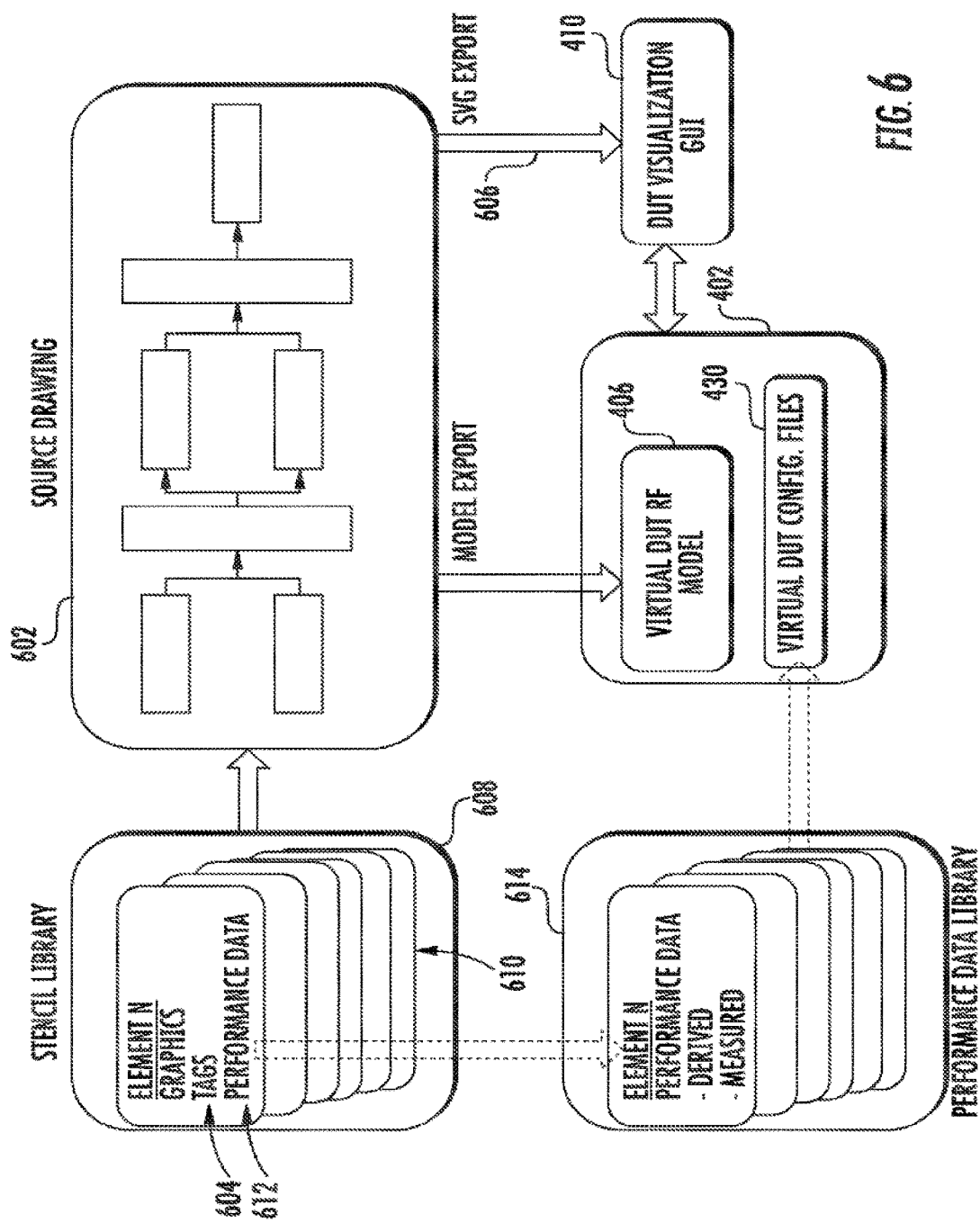

To further illustrate example implementations of the present disclosure, FIGS. 4, 5 and 6 illustrate an EBD 400 that corresponds to the EBD 300 of FIG. 3 in some example implementations. The EBD at the highest level in one example may be thought of as three separate executable applications, namely, (1) a virtual test system (VTS) 402 including virtual modular test system (MTS) instruments 404 (virtual test equipment 304) and a virtual device under test (DUT) 406 (e.g., virtual satellite payload transponder 302); (2) a test executive 408; and (3) a DUT visualization graphical user interface (GUI) 410 (visualization tool 318). In some examples, the test executive includes one or more test scripts 412 (modular test system software 308) that may issue commands 414, queries or the like, and may also include virtual instrument management functionality 416. As also shown, in some examples, the EBD may include a virtual Ethernet link 418 (virtual Ethernet layer network) between the VTS and the test executive, and a Transmission Control Protocol (TCP) or User Datagram Protocol (UDP) socket (shown by example as TCP socket 420) to connect VTS and the DUT visualization GUI. As explained in further detail below, FIG. 5 illustrates inter-process communications within the EBD.

The EBD 400 is generally configured to provide a virtual environment in which to test the RF performance of both passive and active RF payload components as well as the satellite payload RF pathways. This is separate and distinct from signal pathways that may be tested by the wiring harness subsystem 104.

In some examples, operation of active RF payload units is controlled by the spacecraft control electronics through the satellite harness. Passive RF payload units are not subject to telemetry and control (T&C), but are part of an evaluation of RF performance since they do affect the RF signal passing through the payload. The EBD is configured to provide the ability to identify design errors in the RF pathways and a DUT engineering database 422 (e.g., satellite systems engineering database (SSED)) so that they can be corrected prior to the actual build of the satellite hardware, and provides a means of testing and correcting test script errors as well as MTS RF instrument configuration files prior to test of actual satellite hardware.

In some examples, the EBD 400 provides the ability to assess end-to-end satellite payload performance for a number of objectives. These objectives include gaining early performance knowledge on the designed payload's ability to meet contractual requirements during the proposal phase. The objectives include managing actual satellite performance margin of the fully integrated payload (including auxiliary components such as waveguides, coaxial cables, etc.). And the objectives include providing realistic mass, power and thermal dissipation estimates based on actual data that directly integrates with satellite detailed design tools.

In some examples, a customizable satellite payload DUT 406 includes virtual RF component models (virtual modules of RF communications circuitry 306). In some examples, the virtual DUT is built from a library of virtualized component types architected to have a standardized modular framework with a scalable and customizable backbone of metadata representing component performance, physical component characteristics, and virtual component interfaces that can be uploaded without any modification to the virtual DUT.

Although the EBD 400 is separate and distinct from the wiring harness subsystem 104, in some examples they may be integrated. In these examples, the integration may combine the functionality of both into a single tool to control RF signal behavior within the DUT through a virtual harness instead of through logical interpretation of T&C commands.

Turning first to the virtual MTS instruments 404, in some examples, it is desirable to have their be a dynamic process so that a user can change instrument configurations, Internet Protocol (IP) addresses, port numbers, etc. without requiring a new software executable to be created each time a configuration item changes. For example, consider if the user needs to run a series of test scripts against virtual instruments with a different set of IP addresses than what was needed when the software executable was built, the application should be able to satisfy this use case. In some examples, an instrument factory may provide the desirable dynamic creation of the virtual MTS instruments.

The instrument factory contains a method for creating every type of virtual MTS instrument available in a virtual instrument library from which the virtual MTS instruments 404 may be selected. Each of these methods also takes the instrument specific configuration information as a parameter so the configuration of the instrument model can be changed at run time of the VTS 402. The VTS may achieve this by parsing an input file for a list of instrument models to create and their associated configurations and then calling that instrument's creation method, providing it the configuration details found in the input file. By following this process, the user can quickly change a variety of instrument configurations without recompiling the application executable.

In some examples, the virtual MTS instruments 404 include an RF functional model implemented in model-based design (MBD) (if the MTS instrument has RF input or output), driver code that handles the command and status interface to the test executive 408 over the virtual Ethernet link 418, and model initialization functions that dynamically initialize a generic instrument model into a specific configuration. Some instruments, such as power supplies and digital multi-meters, do not have RF interfaces, and will not have an RF functional model. These instruments, however, still utilize a driver to communicate with the test executive. One example of a suitable MBD technology for the satellite implementation of the virtual MTS instruments is Simulink, although the virtual MTS instruments can be created with other MBD technologies or even hand coded.

In some examples, MTS instruments nominally include an uplink rack and a downlink rack. Uplink instruments are generally used to generate and analyze RF signals sent to a DUT. A typical assortment of uplink instruments could include commercial off-the-shelf (COTS) frequency synthesizers, arbitrary waveform generators, RF power meters, RF spectrum analyzers, signal routing equipment, as well as custom-made instruments and equipment.

Downlink instruments are generally used to receive and analyze RF signals acquired from a DUT. A typical assortment of downlink instruments could include COTS RF power meters, RF spectrum analyzers, signal routing equipment, as well as custom-made instruments and equipment.

The virtual MTS instruments 404 implement simulations of the MTS instruments in a manner that allows them to be controlled in a manner identical to that of the physical instruments. These instrument models provide simulated signal generation and acquisition as well as analysis capability with sufficient fidelity to represent the device for testing purposes and test station software development. The virtual instruments often do not but may completely emulate a physical instrument.

The virtual MTS instruments 404 provide the ability to generate or analyze RF signals as required by the defined instrument functionality. As these models can simulate instruments operating over any pre-defined functional frequency range, signals passed between instruments and the virtual DUT 406 may be defined as a vector of one-dimensional IQF arrays. IQF is a quadrature representation, with "I" being the real component, "Q" being the imaginary/phase component, and "F" being frequency. This eliminates the need for a virtual system to pass high frequency information as discrete samples in the time domain, which would be computationally intensive for any desired real-time response. Other additional information could be also passed within an expanded vector structure, such as a time stamp or binary information representative of the IQF signal vector.

In some examples, each virtual MTS instrument 404 also has an associated driver that contains an interface to the virtual Ethernet link 418, as well as handles instrument commands and data/status request to and from the test executive 408. In some examples, the virtual MTS instruments 404 are developed using the C++ programming language, and in these examples, the associated driver is a C++ driver. Implementation of the command and status functions allows them to interact with the test executive and fully satisfy the test executive instrument communications requirements. The virtual Ethernet link to the test executive allows the test executive to communicate with the virtual MTS instruments using the same protocols contained within the physical instruments. In some examples, the physical layer of the Ethernet communications stack is replaced with the virtual Ethernet link.

In some examples, the models of RF components contained in the virtual DUT 406 include an RF functional model implemented in MBD tools, as well as driver code that handles the DUT component command and status interface to the test executive 408, and model initialization functions that dynamically initialize a generic component model into a specific configuration. Again, Simulink is an example of a suitable MBD technology for the satellite implementation of the RF components, although these RF components could be created with other MBD technologies or even hand coded.

The virtual DUT 406 provides the ability to modify RF signals as required by the defined component functionality. As these components models can simulate components operating over any pre-defined functional frequency range, signals passed within and outside the virtual DUT may be defined as a vector of one-dimensional IQF arrays. Similar to before, this eliminates the need for the virtual DUT to pass high frequency information as discrete samples in the time domain, which would be computationally intensive for any desired real-time response.

In some examples, each RF component model (virtual module of RF communications circuitry 306) of the virtual DUT 406 also has a virtual DUT interface 424 that contains an interface to the virtual Ethernet link 418 and TCP socket 420, and handles instrument commands and data/status requests to and from the test executive 408. Implementation of the command and status functions for DUT components allows them to interact with the test executive and fully satisfy the test executive DUT communications requirements.

The virtual Ethernet link 418 provides the ability for the test executive 408 to communicate with the virtual MTS instruments 404 using the same Ethernet protocol and addresses used by the physical instruments. A virtual Ethernet network interface controller (NIC) could be provided by an operating system such as Microsoft Windows or Linux. The virtual NICs could then be configured with the IP addresses that would normally be used to access the physical instruments. Network interface code within each of the virtual MTS instruments provides access to network traffic across the virtual NICs. Virtual NICs are also used to communicate with the DUT visualization GUI 410.

The test executive 408 includes virtual instrument management functionality 416 to manage the virtual MTS instruments 404, and DUT test script(s) 412 to send commands 414 to the virtual MTS instruments and the virtual DUT 406 including its components, read status information from the virtual MTS instruments and DUT components, and perform data analysis as needed. In simpler examples, the test executive is implemented as an application that that allows a user to send commands and retrieve status at a command line or GUI selection. In more complex examples, the test executive is implemented as a system that manages instrument drivers and calibration databases, manages test result databases, and runs complex scripts that control the DUT components and the virtual MTS instruments.

As also shown, in some examples, the VTS 402 further includes a VTS configuration GUI 426, which is a user interface that provides a variety of controlling and monitoring capabilities for the virtual MTS instruments 404. The EBD 400 provides the user the ability to run test scripts 412 prior to hardware availability, and the visualization GUI provides features so that test scripts can be efficiently analyzed and debugged. These analysis and debugging features include virtual connection changes, instrument table, monitoring capabilities, and bus viewer.

In conventional processes, test scripts running against physical hardware requires the user to physically change cabling between power monitoring devices so that specific measurements can be made. Since the EBD 400 of example implementations operates in a virtual environment where there is no physical cabling, the VTS configuration GUI 426 in some examples provides the user with the ability to change the virtual connections paths to mimic the cabling change performed during testing with corresponding physical hardware. By providing the ability to virtually swap connections, the exact same test script that is run with the physical hardware can also be used with the virtual hardware allowing for the debugging of test steps and results before any physical hardware is available.

In some examples, VTS configuration GUI 426 provides the instrument table. The instrument table contains a table of virtual instruments created by the instrument factory, as well instrument information such as but not restricted to IP address, instrument name, cycle time, TCP or UDP port number, printing of debug messages, etc. The instrument table provides the ability for the user to determine if the instruments are in the correct configuration based on the assigned IP address and port number. In some examples in which the virtual MTS instruments 404 are developed using the C++, and the GUI is developed using the C# programming language, the GUI may also allow the user to change how often the C++ driver cycles by updating the cycle time value as well as change whether or not debug messages are displayed to a console window. The instrument table allows the user to view, and in some cases edit, important instrument information all in one location.

In some examples, VTS configuration GUI 426 also provides a number of monitoring capabilities to help the user debug test scripts 412. One such monitoring capability is the aforementioned console window. The console window allows for debugging statements that are implemented within the virtual MTS instruments 404 to be displayed to the user. These statements can be a variety of messages including commands 414 received by the instrument, query instrument responses, display the current state of the instrument if it was developed as a state machine, or anything else the deemed as informative. Each virtual MTS instrument has a selectable debugging option so that the user can specify exactly which instruments debug information they want to see. By providing this ability to the user, test script sequencing can be analyzed to determine if the instrument received the commands in the correct order as well as if the command format was correct for executing the desired command. Command formats could be industry standard such as Standard Commands for Programmable Instruments (SCPI) or High Speed LAN Instrument Protocol (HiSLIP), or proprietary formats.

Another example of a monitoring capability of the VTS configuration GUI 426 is a bus viewer. Each virtual MTS instrument 404 has a structure of data that goes from the driver (e.g., C++ driver) to the underlying instrument model. The bus viewer provides the user with the ability to view the value of the data being passed from the driver to the instrument model. By allowing the user to view the information, the user is able to check if their test scripts 412 are getting the instruments into the correct setting for running their test. For example, the user wanted to set a signal generator to providing a 10 gigahertz (GHz) output but wasn't sure if the command they were sending was actually setting it. This could be resolved by checking the bus viewer to see if the driver was telling the instrument model to generate a 10 GHz output.

These monitoring and control capabilities make the VTS configuration GUI 426 a very powerful tool. It provides the user with the ability to perform steps in their test scripts 412, as well as more visibility into the state of each virtual MTS instrument 404 and how the virtual MTS instruments are responding to the commands 414 and queries issued by their test script.

As mentioned above, in some examples, the VTS configuration GUI 426 is developed using the C# programming language, and the virtual MTS instruments 404 are developed using the C++ programming language. In these examples, the EBD 400 further includes a bridge between the managed code of C# and the unmanaged code of C++. It should be understood, however, that the visualization GUI and virtual MTS instruments could be implemented in many different programming languages, and that the bridge may not be used in all implementations.

The bridge operates to convert data between the managed code of C# and the unmanaged code of C++. In some examples, the bridge is developed using the C++/CLI programming language which provides the bridge with the ability to convert between managed data types and unmanaged data types. The bridge provides an interface between the VTS configuration GUI 426 and the commanding and querying of the virtual MTS instruments 404.

Both of these types of communication follow the same basic structure. First, the C# VTS configuration GUI 426 calls a function from the bridge, passing in the managed version of the data as a parameter. Second, the bridge converts that managed data into unmanaged data that is compatible with C++. If C# is attempting to get a structure worth of data, the structure is an array in C# but becomes a pointer to the front of that array in the bridge. Third, the bridge calls the corresponding C++ function that exists within the instrument models passing in the C++ version of the parameters. Fourth, after the instrument models function completes, the bridge converts any values that are returning to C# to the managed version of the data. Finally, the data is returned to C#.

In some examples, the EBD 400 initializes the virtual MTS instruments 404 and virtual DUT 406 in a manner that allows dynamic configuration of either or both at startup and during run-time. In this example, these variables are stored in files 428 and 430 that correspond to each MTS instrument and virtual DUT component requiring such configuration flexibility. These configuration variables would normally be constants in software; for example, fixed gain value, operating frequency range and amplitude range. This dynamic configuration capability provides the ability to create or fine tune a virtual MTS instrument or virtual component of the virtual DUT with completely different characteristics, all without the need to rebuild and restart the EBD.

In some examples, at program start, a unique configuration file 428 for each virtual MTS instrument 404 containing operating characteristics is read in and used to initialize configuration variables in the functional model as well as the driver code. These variables may be of any standard numeric type (e.g., signed/unsigned integers of sizes supported by the compiler, float, and double). This configuration file may be within the scope of source file configuration management, so any changes made during run-time are made to a temporary copy of the configuration file. If permanent changes are desired, then these may be made within the rules governing local configuration management.

In some examples, at program start, a unique configuration file 430 for each virtual DUT model 406 containing operating characteristics is read in and used to initialize configuration variables in the functional model as well as the driver code. These variables may be of any standard numeric type (e.g., signed/unsigned integers of sizes supported by the compiler, float, and double). This configuration file may be within the scope of source file configuration management, so any changes made during run-time are made to a temporary copy of the configuration file. If permanent changes are desired, then these may be made within the rules governing local configuration management.

In operation, the visualization GUI 410 may provide a real-time graphic depiction of active virtual components of the virtual DUT 406 and active signal pathways. In some examples, as shown in FIG. 6, this drawing is derived from a DUT diagram 602 populated with tags 604 and corresponding tag meta-data.

In some examples, the drawing is exportable in a Scalable Vector Graphic (SVG) format 606 that is used as a data source for presentation in the DUT visualization GUI 410 or web browser, and contains the tags in drawing object data. The tags may include any of a number of different pieces of structural information, and in some examples may identify a DUT component type (e.g., switch, amplifier, etc.) of a virtual DUT component, a unique text identification, and/or other virtual DUT components connected to the subject virtual DUT component (e.g., by connecting wire). Another, optional tag can describe positional-dependent GUI operation (such as identification of pin 1 of a component with multiple pins, or the order of pin numbering around a component, or additional component-specific information). The tags provide a convenient means of uniquely identifying and manipulating graphic elements within a web browser compliant file format.

In some examples, the drawing is composed of elements from a stencil library 608. The elements 610 within this library contain performance data 612 about the virtual DUT component that is pertinent to the operating characteristics of the component (e.g., nominal DC power consumption, frequency response characteristics, and gain/loss characteristics). The operating characteristics of the component may be derived from specifications or as imports or regressions of payload unit performance data. These characteristics may be directly embedded within the stencil element itself, or the stencil element may contain a reference to an external source or database of these operating characteristics 614. These stencil elements are constructed such that their inputs and outputs are defined in a manner consistent with the physical element being modeled, including connector and pin identification.

In some examples, the elements in the stencil library 608 are constructed such that the graphic portions for types of elements are generic, and the operating characteristics of the represented component may be easily changed for a given element in the stencil library. For example, a traveling wave amplifier tube type element could be defined by one element in the library, with specific component instances of this type being defined through the customizable stencil meta-data.

In some examples, the elements in the stencil library 608 are constructed such that physical connections being modeled are constructed with graphic elements that provide a latching connection point that is compatible with connecting elements such as a virtual waveguide or virtual coaxial cable model.

In some examples, the unique configuration file for each virtual DUT model as referenced at initialization may be derived from an external source of the operating characteristics as referenced by the stencil element.

In some examples, execution of the executable block diagram to perform the simulation of the executed satellite payload transponder and measurement of RF signal performance utilizes the operating characteristics of the virtual payload units as derived from specifications or as imports or regressions of payload unit performance data.

The DUT visualization GUI 410 is connected to the VTS 402 through the TCP socket 420 and receives the same commands 414 that are sent to the virtual components of the virtual DUT 406. When a command is received that indicates that a component is turned on, the component graphic will be located and highlighted in the DUT visualization GUI to show its status. In some examples, the DUT visualization GUI includes a wire evaluator 432 to examine the topology of the active virtual components of the virtual DUT, and determine which interconnecting wires in the drawing are carrying active signals, and causes these wires to be highlighted in the drawing.

In some examples, the wire evaluator 432 subscribes to the same agent that provides commands to the virtual DUT 406, as well as optional virtual DUT status modifications made within user control of the DUT visualization GUI 410. The wire evaluator builds an adjacency matrix that allows interconnecting signal paths within the visualization GUI to be highlighted depending upon the active or inactive status of virtual DUT components connected to the signal paths. This permits the user of the EBD 400 to visualize the status of virtual DUT component interconnections as well as the virtual DUT component statuses.

In some examples, the VTS 402 simulation does not produce the current status of connections between components of the virtual DUT 406 that is being simulated. The status of each wire corresponds to it either carrying a signal (active) or not carrying a signal (inactive). The status of the wires can be inferred from the status of the other components in the satellite payload being simulated whose status is produced by the simulation. For example, if a signal source is active, then the output wire must also be active.

Figure 7:
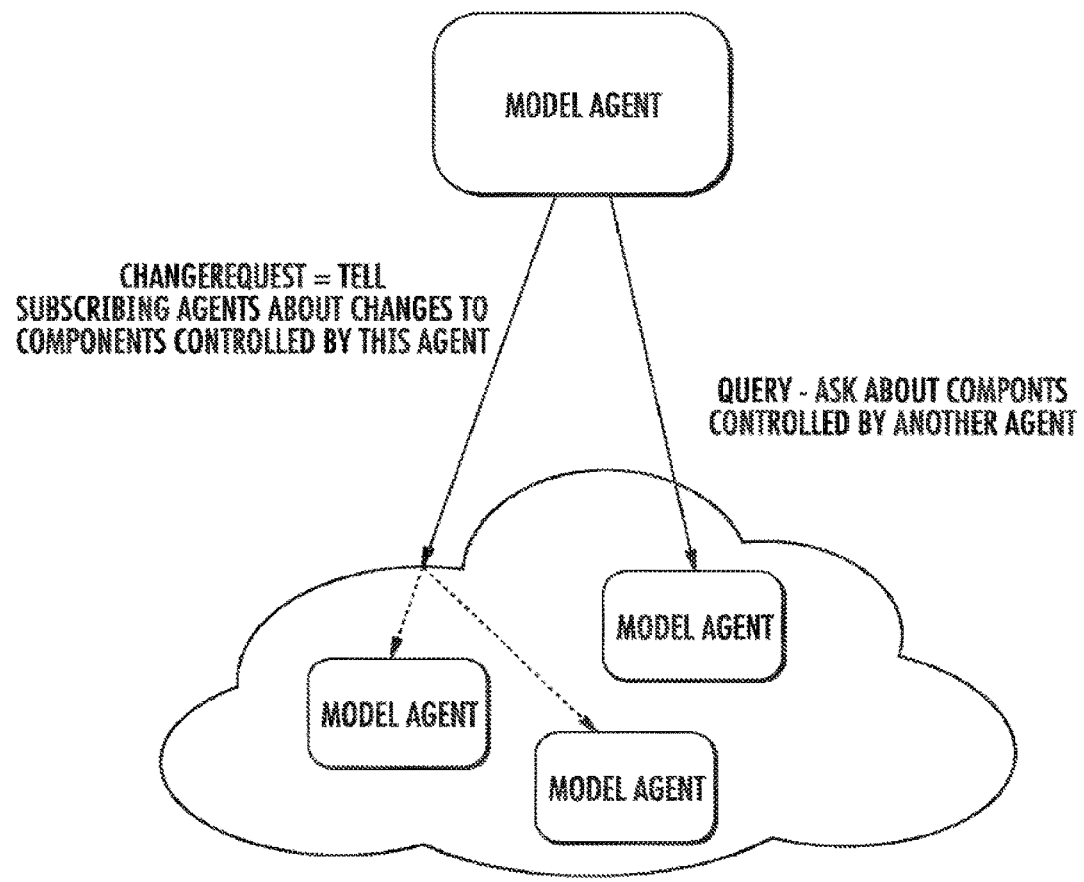
FIGS. 7-15 illustrate aspects of a wire evaluator of the EBD of FIGS. 4, 5 and 6, according to example implementations.
Figure 8:
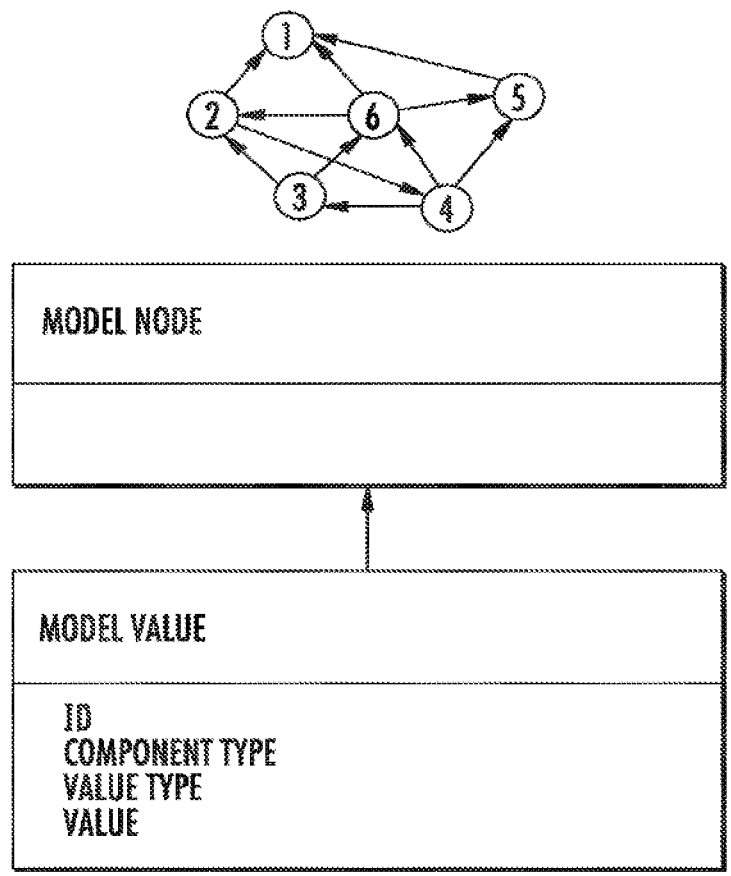

In order to add this kind of inferred component status, the EBD 400 may use a model agent architecture. The model agent architecture provides an abstraction for entities that manage the states of simulated components. Multiple model agents may be involved in the simulation of a virtual subsystem, each controlling the states of a subset of the subsystem components. A model agent can subscribe to state information controlled by other model agents using a subscription mechanism for change requests (e.g., commands). Alternatively, a model agent can directly query other model agents for state (e.g., status) information. FIG. 7 is a diagram that illustrates both mechanisms. State information is encapsulated and exchanged between model agents via model values that inherit from model nodes, as shown in FIG. 8.

In some examples with a multi-agent architecture such as this, there is a system of common component identification that is shared between the agents. If an agent A is to subscribe to information about a specific component published by agent B, both agents have an agreement as to how to identify that component.

Figure 9:
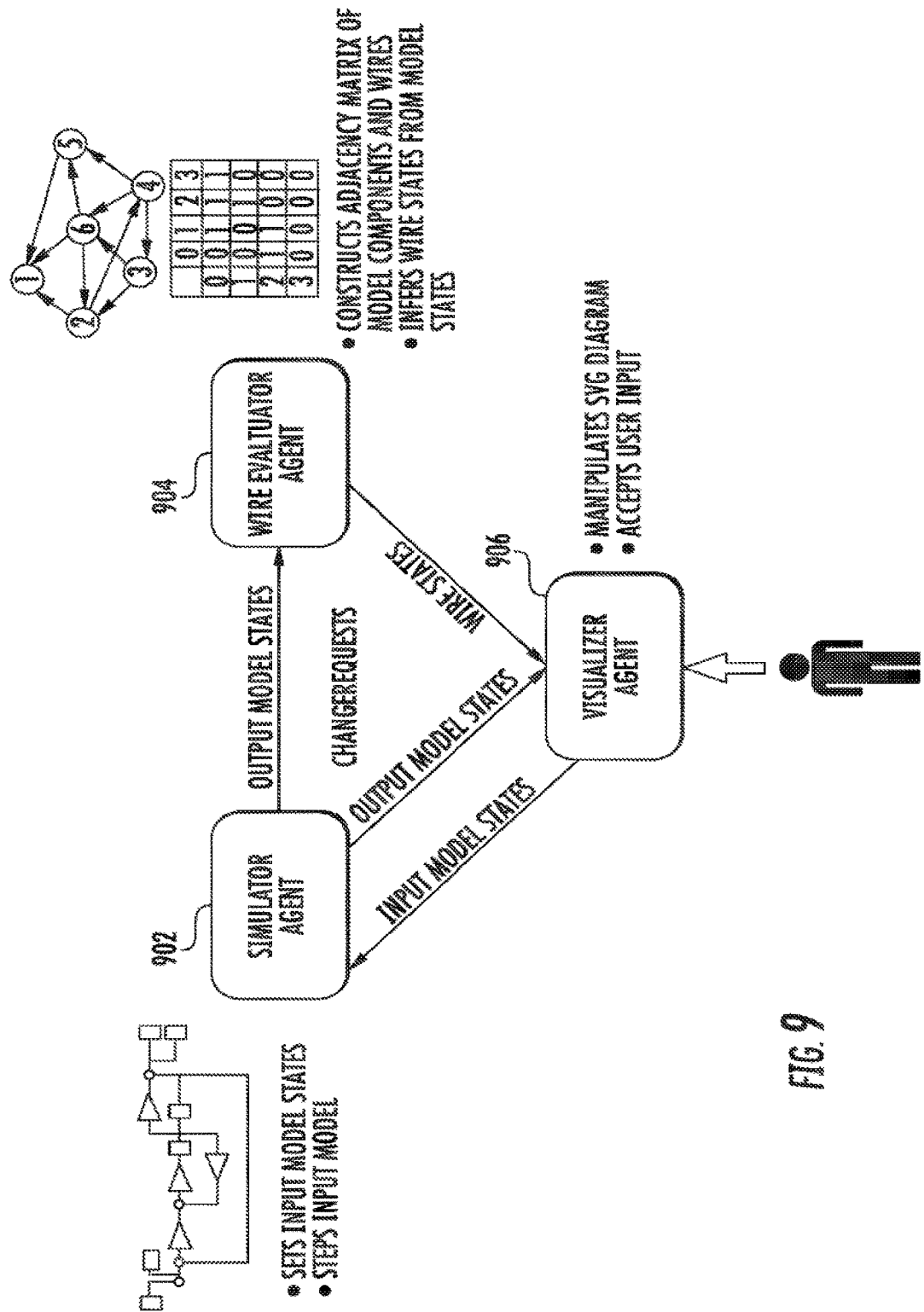

In some examples, the wire evaluator 432 is a specific type of model agent that infers the state of wire components based on the states of other connected components. The inference engine for the wire evaluator is based on an adjacency matrix of components. FIG. 9 illustrates a suitable wire evaluator agent 902 in conjunction with a simulator agent 904 and a visualizer agent 906. The simulator agent publishes state information for components contained in a suitable model (e.g., MATLAB®/SIMULINK® model), and subscribes to changes from the visualizer agent representing inputs from the user. Both the visualizer agent and the wire evaluator agent subscribe to state information from the simulator agent; the visualizer agent directly displays that state information to the user while the wire evaluator agent incorporates it into the adjacency matrix to infer new wire component state information to send to the visualizer agent.

Figure 10:
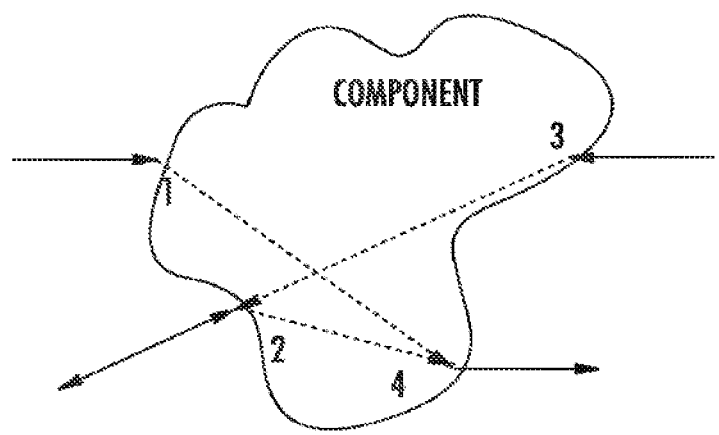

In some examples, for the purpose of constructing the adjacency matrix, subsystem components have an abstract representation consisting of "active" or "inactive" state, and arbitrarily configurable ports which allow directed or undirected connections internally between ports and externally to other components. This is shown in FIG. 10.

Figure 11:
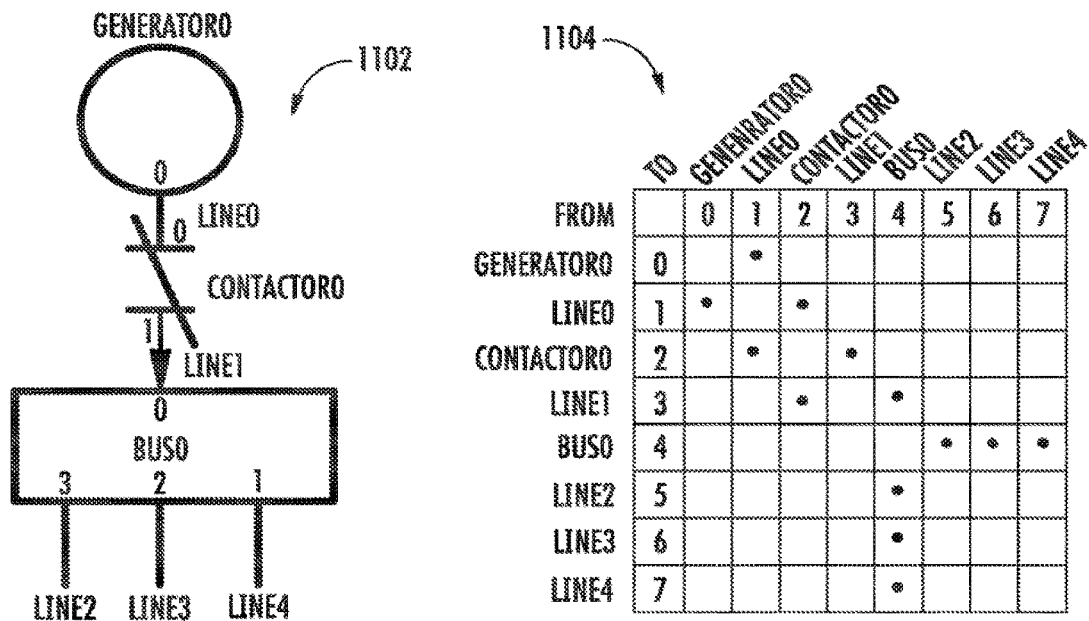

Connection paths internal to components are supported in order to model signal routing through complex switches and buses that are common in VTS 402 simulations. FIG. 11 illustrates an example component network 1102 and its corresponding adjacency matrix 1104. Note that this example contains one component that has internal component connections, the contactor. The eight components involved in this example are a generator that can be on or off, a contactor that can be open or closed, a bus that can be energized or not energized and five wires that can be energized or not energized. In this example, the generator status, the contactor status and the bus status are given by the simulator agent 902, and the status of the five wires is given by the wire evaluator agent 904.

In this example, wire connection information inside the drawings used by the visualizer agent 906 to avoid the simulator agent 902 having to make the wire connection information available to the other agents. The wire evaluator agent 904 queries the visualizer agent at system start up time to obtain the wire connection information.

Figure 12:
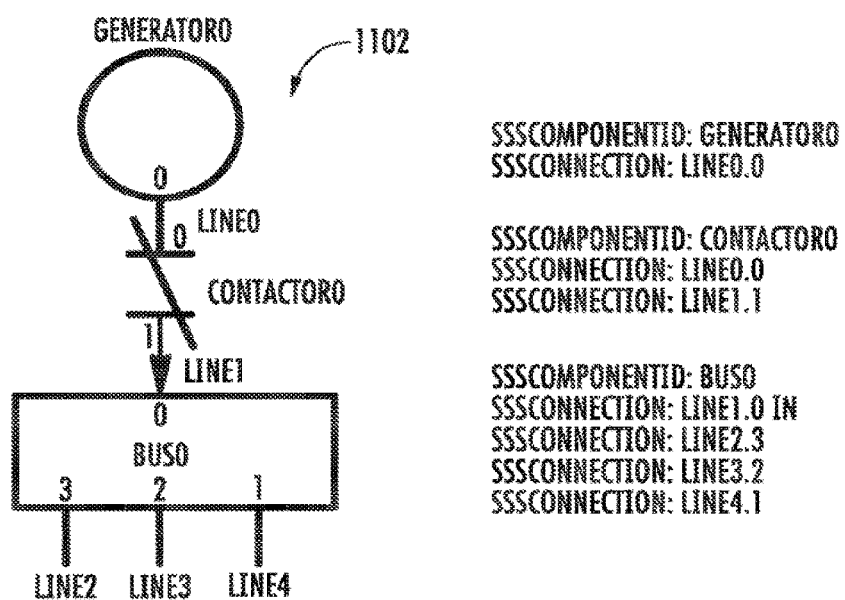

FIG. 12 illustrates how the wire connection information is encoded in the visualizer agent 906 drawings. For example, the component identified as Generator0 has a connection to a component identified as Line0 at a port identified as port 0 on Generator0. The connection between Line1 and Bus0 is identified as a directed "in" connection. This mechanism allows control over cycles in the signal graph.

Figure 13:
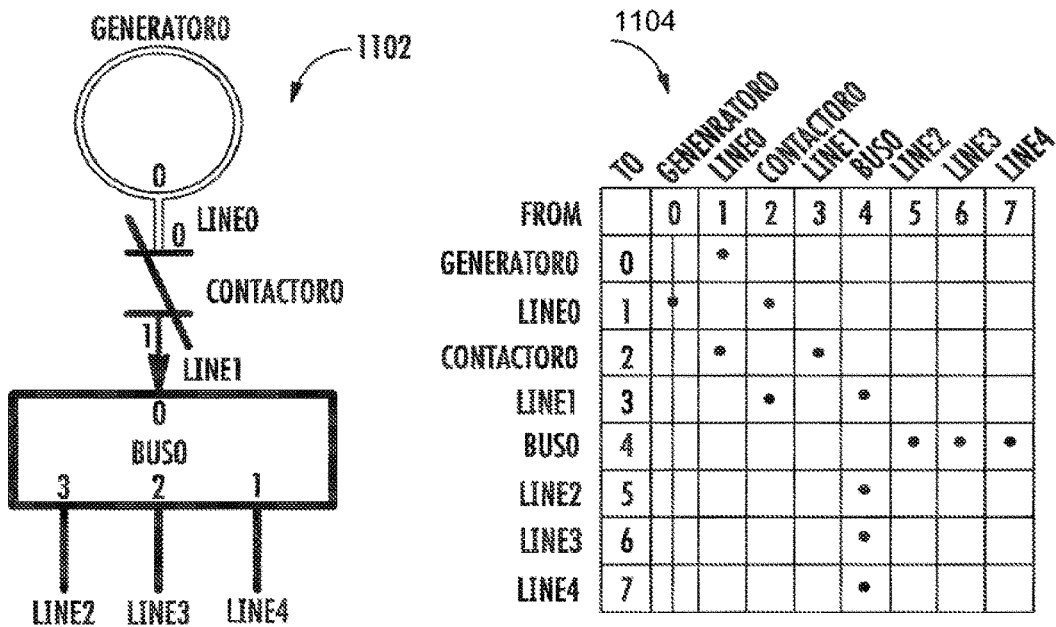

At system start up, the wire evaluator agent 904 builds an internal adjacency matrix using the connection information it receives from the visualizer agent 906. At this time, the wire evaluator agent also subscribes to component state changes that are being published by the simulator agent 902. At run time, the wire evaluator 432 receives state change events for components through its simulator agent subscriptions and determines the wire connections for those components by querying the adjacency matrix. This is shown in FIG. 13.

When a component becomes active and the wire evaluator agent 904 locates a wire connection with that component, the wire evaluator agent publishes a wire status change of active. The visualizer agent 906 which has subscribed to these publications then illuminates the corresponding wire in the schematic of the system.

Figure 14:
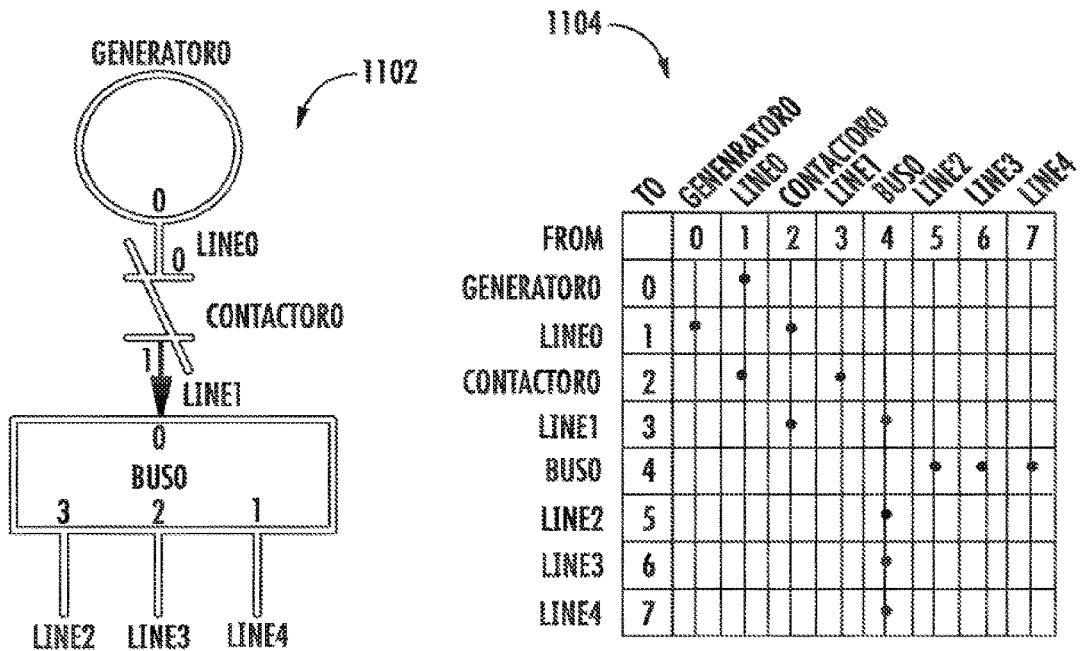

In FIG. 14, Generator0 is identified by the wire evaluator agent 904 as a signal source. The wire evaluator agent does a traversal of the connectivity graph whose edges are connections and whose nodes are components. The wire evaluator agent uses the information from the simulator agent 902 to determine the states of components that the simulator agent publishes status about and infers the status of the wires. Information as to which components are understood to be signal sources can be obtained by an additional annotation for that component in the visualizer agent 906 drawing. In this example, the statuses of Generator0, Contactor0 and Bus0 are all obtained using simulator agent subscriptions to those component states. The statuses of Line0, Line1, Line2, Line3 and Line4 are inferred by the wire evaluator algorithm. It is assumed in this example that the simulator agent publishes active statuses for Generator0, Contactor0 and Bus0.

Figure 15:
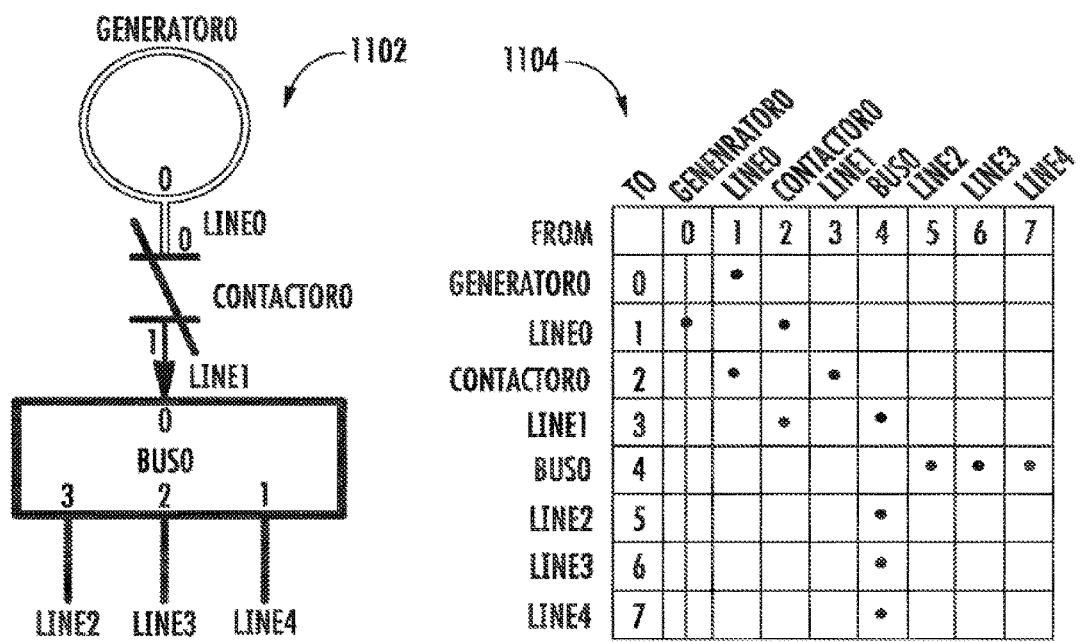

In the next example, as shown in FIG. 15, it is assumed that the simulator agent 902 publishes an active status for Generator0 and inactive statues for Contactor0 and Bus0. The wire evaluator agent 904 assumes that active statuses for components allow signals to propagate through them and that inactive statuses do not.

Figure 16:
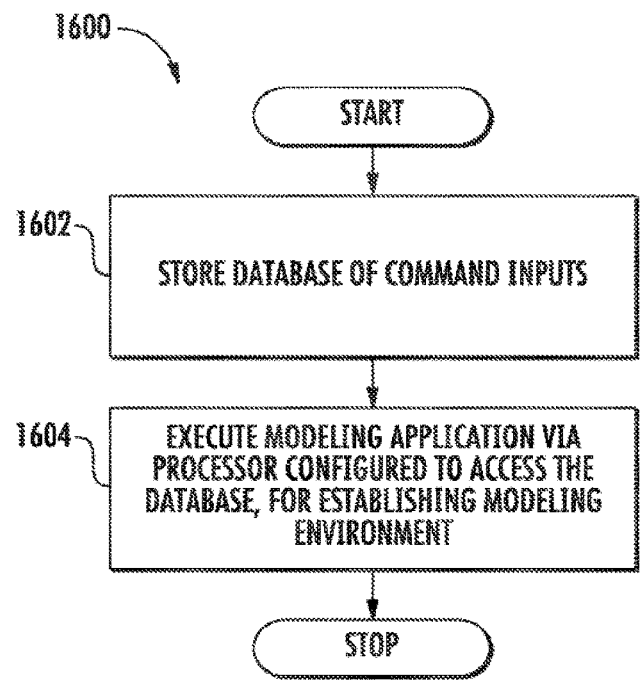
FIG. 16 is a flowchart illustrating various steps in a method of testing a design of a satellite payload transponder with modules of RF communications circuitry including telemetry and command functionality, according to various example implementations.

FIG. 16 is a flowchart illustrating various steps in a method 1600 of testing a design of a satellite payload transponder with modules of RF communications circuitry including telemetry and command functionality. As shown at block 1602, the method includes storing in memory a database of command inputs 202. As shown at block 1604, the method also includes executing a modeling application 204, via a processor configured to access the database of command inputs, for establishing a modeling environment for establishing the executable block diagram 300, and generating a virtual satellite payload transponder 302 and virtual test equipment 304.

The virtual satellite payload transponder 302 has virtual modules of RF communications circuitry 306 including telemetry and command functionality, with functionality equivalent to that of the satellite payload transponder with modules of RF communications circuitry including the telemetry and command functionality. The functionality is configured according to command input from the database and includes generating a particular RF signal performance and telemetry response to a given RF waveform stimulus and configuration of the satellite payload transponder.

According to the method 1600, the virtual test equipment 304 has functionality equivalent to that of physical test equipment in conjunction with modular test system software, and the virtual test equipment includes virtual RF uplink and downlink signal components 310 with functionality equivalent to that of physical test equipment RF uplink and downlink signal components. The virtual RF uplink and downlink signal components include a virtual RF waveform generator 312, a virtual power sensor 314 and a virtual signal analyzer 316. The virtual RF waveform generator has functionality equivalent to that of a physical RF waveform generator, and for generating a simulation of an RF waveform stimulus. The virtual power sensor has functionality equivalent to that of a physical power sensor, and for analyzing the generated simulation of the RF waveform stimulus. And the virtual signal analyzer has functionality equivalent to that of a physical signal analyzer, and for analyzing RF signal performance to the generated simulation of the RF waveform stimulus.

Also according to the method 1600, the modeling environment establishes the executable block diagram 300 for performing a simulation of executed satellite payload transponder command, RF signal performance and telemetry response testing. This simulation is performed utilizing a given version of the modular test system software 308 corresponding to the modules of RF communications circuitry including the telemetry and command functionality of the design of the satellite payload transponder.

According to example implementations of the present disclosure, the system 100 and its subsystems including the communications module subsystem 102 and the wiring harness subsystem 104 may be implemented by various means. Means for implementing the system and its subsystems may include hardware, alone or under direction of one or more computer programs from a computer-readable storage medium. In some examples, one or more apparatuses may be configured to function as or otherwise implement the system and its subsystems shown and described herein. In examples involving more than one apparatus, the respective apparatuses may be connected to or otherwise in communication with one another in a number of different manners, such as directly or indirectly via a wired or wireless network or the like.

Figure 17:
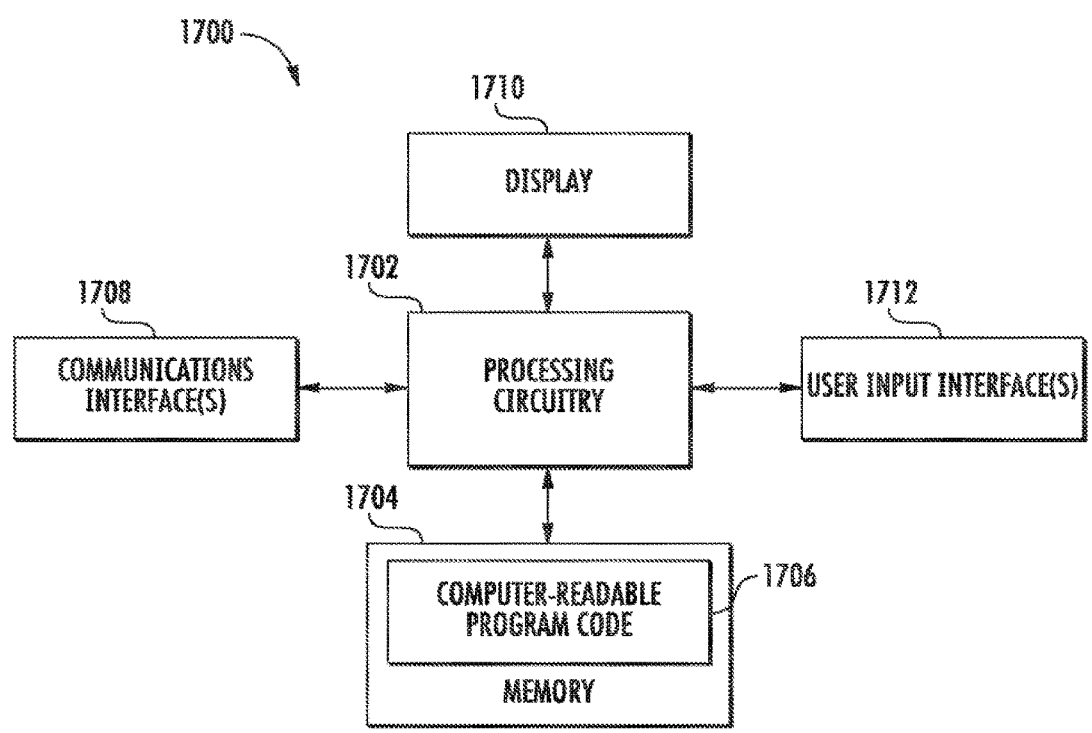
FIG. 17 illustrates an apparatus according to some example implementations.

FIG. 17 illustrates an apparatus 1700 according to some example implementations of the present disclosure. Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor 1702 (e.g., processor unit) connected to a memory 1704 (e.g., storage device).

The processor 1702 may be composed of one or more processors alone or in combination with one or more memories. The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 1704 (of the same or another apparatus).

The processor 1702 may be a number of processors, a multi-core processor or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more ASICs, FPGAs or the like. Thus, although the processor may be capable of executing a computer program to perform one or more functions, the processor of various examples may be capable of performing one or more functions without the aid of a computer program. In either instance, the processor may be appropriately programmed to perform functions or operations according to example implementations of the present disclosure.

The memory 1704 is generally any piece of computer hardware that is capable of storing information such as, for example, data, computer programs (e.g., computer-readable program code 1706) and/or other suitable information either on a temporary basis and/or a permanent basis. According to example implementations, this may include the modeling application 202 and the testing application 204. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 1704, the processor 1702 may also be connected to one or more interfaces for displaying, transmitting and/or receiving information. The interfaces may include a communications interface 1708 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 1710 and/or one or more user input interfaces 1712 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processor that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that, one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by processor, or storage of instructions in a computer-readable storage medium, supports combinations of operations for performing the specified functions. In this manner, an apparatus 1700 may include processor 1702 and a computer-readable storage medium or memory 1704 coupled to the processor, where the processor is configured to execute computer-readable program code 1706 stored in the memory. It will also be understood that one or more functions, and combinations of functions, may be implemented by special purpose hardware-based computer systems and/or processor which perform the specified functions, or combinations of special purpose hardware and program code instructions.

As described herein, the present disclosure includes, without limitation, at least the following example implementations.

Example implementation 1: An apparatus for testing a design of a satellite payload transponder with modules of RF communications circuitry including telemetry and command functionality, the apparatus comprising a processor and a memory storing executable instructions that, in response to execution by the processor, cause the apparatus to at least execute a modeling application, via the processor configured to access a database of command inputs, for establishing a modeling environment for generating: a virtual satellite payload transponder with virtual modules of RF communications circuitry including telemetry and command functionality, with functionality equivalent to that of the satellite payload transponder with modules of RF communications circuitry including the telemetry and command functionality, where the functionality is configured according to command input from the database and includes generating a particular RF signal performance and telemetry response to a given RF waveform stimulus and configuration of the satellite payload transponder; and virtual test equipment with functionality equivalent to that of physical test equipment in conjunction with modular test system software, the virtual test equipment including virtual RF uplink and downlink signal components with functionality equivalent to that of physical test equipment RF uplink and downlink signal components, the virtual RF uplink and downlink signal components including one or more of each of: a virtual RF waveform generator with functionality equivalent to that of a physical RF waveform generator, and for generating a simulation of an RF waveform stimulus; a virtual power sensor with functionality equivalent to that of a physical power sensor, and for analyzing the generated simulation of the RF waveform stimulus; and a virtual signal analyzer with functionality equivalent to that of a physical signal analyzer, and for analyzing RF signal performance to the generated simulation of the RF waveform stimulus, wherein the modeling environment establishes an executable block diagram for performing a simulation of executed satellite payload transponder command, RF signal performance and telemetry response testing, utilizing a given version of the modular test system software corresponding to the modules of RF communications circuitry including the telemetry and command functionality of the design of the satellite payload transponder.

Example implementation 2: The apparatus of any preceding or any subsequent example implementation, or any combination thereof, wherein the virtual satellite payload transponder is built from a library of virtual modules of RF communications circuitry types architected to have a standardized modular framework with a scalable and customizable backbone of metadata representing module performance, physical module characteristics, and virtual module interfaces, the virtual models of RF communications circuitry being uploaded from the library without any modification to the virtual satellite payload transponder.

Example implementation 3: The apparatus of any preceding or any subsequent example implementation, or any combination thereof, wherein the virtual test equipment are viewed in a table of virtual test equipment types, the table including a list or table of virtual instruments and instrument information including Internet Protocol (IP) address, instrument name, cycle time, and TCP or UDP port number.

Example implementation 4: The apparatus of any preceding or any subsequent example implementation, or any combination thereof, wherein the table further provides access to a debug console for viewing communications between components of the virtual satellite payload transponder and virtual test equipment, as well as a means of providing run-time configuration of the components.

Example implementation 5: The apparatus of any preceding or any subsequent example implementation, or any combination thereof, wherein the executable block diagram defines a virtual test system that includes the virtual satellite payload transponder and the virtual test equipment, and a test executive that includes the modular test system software, and wherein the executable block diagram includes virtual Ethernet link for the virtual Ethernet layer network between the virtual test system and the test executive.

Example implementation 6: The apparatus of any preceding or any subsequent example implementation, or any combination thereof, wherein the apparatus being caused to execute the modeling application includes being caused to execute the modeling application for establishing the modeling environment for further generating a virtual Ethernet layer network for transmission of the executed satellite payload transponder command, RF signal performance and telemetry response.

Example implementation 7: The apparatus of any preceding or any subsequent example implementation, or any combination thereof, wherein the executable block diagram defines a virtual test system that includes the virtual satellite payload transponder and the virtual test equipment, and a test executive that includes the modular test system software, and wherein the executable block diagram includes virtual Ethernet link for the virtual Ethernet layer network between the virtual test system and the test executive.

Example implementation 8: The apparatus of any preceding or any subsequent example implementation, or any combination thereof, wherein the memory stores executable instructions that, in response to execution by the processor, cause the apparatus to further execute the executable block diagram to perform the simulation of the executed satellite payload transponder command, RF signal performance and telemetry response testing to test the design of the satellite payload transponder with the modules of RF communications circuitry including the telemetry and command functionality, and to generate a test result.

Example implementation 9: The apparatus of any preceding or any subsequent example implementation, or any combination thereof, wherein the apparatus being caused to execute the executable block diagram includes being caused to execute the executable block diagram to perform the simulation utilizing operating characteristics of the virtual test equipment.

Example implementation 10: The apparatus of any preceding or any subsequent example implementation, or any combination thereof, wherein the apparatus being caused to execute the executable block diagram includes being caused to execute the executable block diagram to perform the simulation utilizing the operating characteristics that are derived from specifications of the physical test equipment.

Example implementation 11: The apparatus of any preceding or any subsequent example implementation, or any combination thereof, wherein the apparatus being caused to execute the executable block diagram includes being caused to execute the executable block diagram to perform the simulation including simulation of the virtual test equipment utilizing the operating characteristics.

Example implementation 12: The apparatus of any preceding or any subsequent example implementation, or any combination thereof, wherein the modeling environment establishes the executable block diagram including a unique configuration file for each of the virtual uplink and downlink signal components, and wherein the apparatus being caused to execute the executable block diagram includes initialization of the executable block diagram in which the unique configuration file is referenced.

Example implementation 13: The apparatus of any preceding or any subsequent example implementation, or any combination thereof, wherein the apparatus being caused to execute the executable block diagram to perform simulation of the executed satellite payload transponder command, RF signal performance and telemetry response testing includes being caused to generate, by the virtual modules of RF communications circuitry, a DC power consumption level output associated with the generated simulation of the RF waveform stimulus and configuration of the satellite payload transponder.

Example implementation 14: The apparatus of any preceding or any subsequent example implementation, or any combination thereof, wherein the memory stores executable instructions that, in response to execution by the processor, cause the apparatus to further characterize the design of the satellite payload transponder based on the test result; and validate the design of the satellite payload transponder based on the characterization.

Example implementation 15: The apparatus of any preceding or any subsequent example implementation, or any combination thereof, wherein the memory stores executable instructions that, in response to execution by the processor, and in an instance in which the design of the satellite payload transponder is validated, cause the apparatus to further identify design requirements for the satellite payload transponder based on the test result; and export the design requirements into requirement specifications for production of the satellite payload transponder with the modules of RF communications circuitry including the telemetry and command functionality according thereto.

Example implementation 16: The apparatus of any preceding or any subsequent example implementation, or any combination thereof, wherein the memory stores executable instructions that, in response to execution by the processor, cause the apparatus to further transmit data packets to a visualization tool configured to output a graphic depiction of the virtual satellite payload transponder with the virtual modules of RF communications circuitry including the telemetry and command functionality.

Example implementation 17: The apparatus of any preceding or any subsequent example implementation, or any combination thereof, wherein the executable block diagram defines a virtual test system that includes the virtual satellite payload transponder and the virtual test equipment, and wherein the executable block diagram includes the visualization tool, and a TCP or UDP socket to connect the virtual test system to the visualization tool.

Example Implementation 18: The apparatus of any preceding or any subsequent example implementation, or any combination thereof, the apparatus further comprises executing the executable block diagram to perform the simulation of the executed satellite payload transponder and measurement of RF signal performance utilizing the operating characteristics of the virtual payload units.

Example implementation 19: The apparatus of any preceding or any subsequent example implementation, or any combination thereof, wherein the visualization tool includes a wire evaluator to examine a topology of active virtual modules of RF communications circuitry of the virtual satellite payload transponder, and determine interconnecting wires in the graphic depiction of the virtual satellite payload transponder that carry active signals, and causes these wires to be highlighted in the graphic depiction.

Example implementation 20: The apparatus of any preceding or any subsequent example implementation, or any combination thereof, wherein the visualization tool is configured to produce the graphic depiction of the virtual satellite payload transponder from a source drawing that includes elements from a stencil library containing or referencing related operating characteristics.

Example implementation 21: The apparatus of any preceding or any subsequent example implementation, or any combination thereof, wherein the related operating characteristics are derived from specifications or as imports or regressions of payload unit performance data. In some examples, this means execution of the executable block diagram to perform the simulation of the executed satellite payload transponder and measurement of RF signal performance utilizes the operating characteristics of the virtual payload units as derived from specifications or as imports or regressions of payload unit performance data.

Example implementation 22: The apparatus of any preceding or any subsequent example implementation, or any combination thereof, wherein the related operating characteristics are used to control RF signal performance and obtained from the elements in the stencil library as placed into the source drawing for the graphic depiction.

Example Implementation 23: The apparatus of any preceding or any subsequent example implementation, or any combination thereof, the apparatus further comprises operating characteristics of the component that may be derived from specifications or as imports or regressions of payload unit performance data. These characteristics may be directly embedded within the stencil element itself, or the stencil element may contain a reference to an external source of these operating characteristics. These stencil elements are constructed such that their inputs and outputs are defined in a manner consistent with the physical element being modeled, including connector and pin identification.

Example Implementation 24: The apparatus of any preceding or any subsequent example implementation, or any combination thereof, the apparatus further comprises the unique configuration file for each virtual module of RF communications circuitry as referenced at initialization which may be derived from an external source of the operating characteristics as referenced by the stencil element.

Example implementation 25: A method of testing a design of a satellite payload transponder with modules of RF communications circuitry including telemetry and command functionality, the method comprising storing in memory a database of command inputs; and executing a modeling application, via a processor configured to access the database of command inputs, for establishing a modeling environment for generating: a virtual satellite payload transponder with virtual modules of RF communications circuitry including telemetry and command functionality, with functionality equivalent to that of the satellite payload transponder with modules of RF communications circuitry including the telemetry and command functionality, where the functionality is configured according to command input from the database and includes generating a particular RF signal performance and telemetry response to a given RF waveform stimulus and configuration of the satellite payload transponder; and virtual test equipment with functionality equivalent to that of physical test equipment in conjunction with modular test system software, the virtual test equipment including virtual RF uplink and downlink signal components with functionality equivalent to that of physical test equipment RF uplink and downlink signal components, the virtual RF uplink and downlink signal components including one or more of each of: a virtual RF waveform generator with functionality equivalent to that of a physical RF waveform generator, and for generating a simulation of an RF waveform stimulus; a virtual power sensor with functionality equivalent to that of a physical power sensor, and for analyzing the generated simulation of the RF waveform stimulus; and a virtual signal analyzer with functionality equivalent to that of a physical signal analyzer, and for analyzing RF signal performance to the generated simulation of the RF waveform stimulus, wherein the modeling environment establishes an executable block diagram for performing a simulation of executed satellite payload transponder command, RF signal performance and telemetry response testing, utilizing a given version of the modular test system software corresponding to the modules of RF communications circuitry including the telemetry and command functionality of the design of the satellite payload transponder.

Example implementation 26: The method of any preceding or any subsequent example implementation, or any combination thereof, wherein the virtual satellite payload transponder is built from a library of virtual modules of RF communications circuitry types architected to have a standardized modular framework with a scalable and customizable backbone of metadata representing module performance, physical module characteristics, and virtual module interfaces, the virtual models of RF communications circuitry being uploaded from the library without any modification to the virtual satellite payload transponder.

Example implementation 27: The method of any preceding or any subsequent example implementation, or any combination thereof, wherein the virtual test equipment are viewed in a table of virtual test equipment types, the table including a list or table of virtual instruments and instrument information including Internet Protocol (IP) address, instrument name, cycle time, and TCP or UDP port number.

Example implementation 28: The method of any preceding or any subsequent example implementation, or any combination thereof, wherein the table further provides access to a debug console for viewing communications between components of the virtual satellite payload transponder and virtual test equipment, as well as a means of providing run-time configuration of the components.

Example implementation 29: The method of any preceding or any subsequent example implementation, or any combination thereof, wherein the executable block diagram defines a virtual test system that includes the virtual satellite payload transponder and the virtual test equipment, and a test executive that includes the modular test system software, and wherein the executable block diagram includes virtual Ethernet link for the virtual Ethernet layer network between the virtual test system and the test executive.

Example implementation 30: The method of any preceding or any subsequent example implementation, or any combination thereof, wherein executing the modeling application includes executing the modeling application for establishing the modeling environment for further generating a virtual Ethernet layer network for transmission of the executed satellite payload transponder command, RF signal performance and telemetry response.

Example implementation 31: The method of any preceding or any subsequent example implementation, or any combination thereof, wherein the executable block diagram defines a virtual test system that includes the virtual satellite payload transponder and the virtual test equipment, and a test executive that includes the modular test system, software, and wherein the executable block diagram includes virtual Ethernet link for the virtual Ethernet layer network between the virtual test system and the test executive.

Example implementation 32: The method of any preceding or any subsequent example implementation, or any combination thereof, wherein the method further comprises executing the executable block diagram to perform the simulation of the executed satellite payload transponder command, RF signal performance and telemetry response testing to test the design of the satellite payload transponder with the modules of RF communications circuitry including the telemetry and command functionality, and to generate a test result.

Example implementation 33: The method of any preceding or any subsequent example implementation, or any combination thereof, wherein executing the executable block diagram includes executing the executable block diagram to perform the simulation utilizing operating characteristics of the virtual test equipment.

Example implementation 34: The method of any preceding or any subsequent example implementation, or any combination thereof, wherein executing the executable block diagram includes executing the executable block diagram to perform the simulation utilizing the operating characteristics that are derived from specifications of the physical test equipment.

Example implementation 35: The method of any preceding or any subsequent example implementation, or any combination thereof, wherein executing the executable block diagram includes executing the executable block diagram to perform the simulation including simulation of the virtual test equipment utilizing the operating characteristics.

Example implementation 36: The method of any preceding or any subsequent example implementation, or any combination thereof, wherein the modeling environment establishes the executable block diagram including a unique configuration file for each of the virtual RF uplink and downlink signal components, and wherein executing the executable block diagram includes initialization of the executable block diagram in which the unique configuration file is referenced.

Example implementation 37: The method of any preceding or any subsequent example implementation, or any combination thereof, wherein executing the executable block diagram to perform simulation of the executed satellite payload transponder command, RF signal performance and telemetry response testing includes generating, by the virtual modules of RF communications circuitry, a DC power consumption level output associated with the generated simulation of the RF waveform stimulus and configuration of the satellite payload transponder.

Example implementation 38: The method of any preceding or any subsequent example implementation, or any combination thereof, wherein the method further comprises characterizing the design of the satellite payload transponder based on the test result; and validating the design of the satellite payload transponder based on the characterization.

Example implementation 39: The method of any preceding or any subsequent example implementation, or any combination thereof, wherein in an instance in which the design of the satellite payload transponder is validated, the method further comprises identifying design requirements for the satellite payload transponder based on the test result; and exporting the design requirements into requirement specifications for production of the satellite payload transponder with the modules of RF communications circuitry including the telemetry and command functionality according thereto.

Example implementation 40: The method of any preceding or any subsequent example implementation, or any combination thereof, wherein the method further comprises transmitting data packets to a visualization tool configured to output a graphic depiction of the virtual satellite payload transponder with the virtual modules of RF communications circuitry including the telemetry and command functionality.

Example implementation 41: The method of any preceding or any subsequent example implementation, or any combination thereof, wherein the executable block diagram defines a virtual test system that includes the virtual satellite payload transponder and the virtual test equipment, and wherein the executable block diagram includes the visualization tool, and a TCP or UDP socket to connect the virtual test system to the visualization tool.

Example Implementation 42: The method of any preceding or any subsequent example implementation, or any combination thereof, the apparatus further comprises executing the executable block diagram to perform the simulation of the executed satellite payload transponder and measurement of RF signal performance utilizing the operating characteristics of the virtual payload units.

Example implementation 43: The method of any preceding or any subsequent example implementation, or any combination thereof, wherein the visualization tool includes a wire evaluator to examine a topology of active virtual modules of RF communications circuitry of the virtual satellite payload transponder, and determine interconnecting wires in the graphic depiction of the virtual satellite payload transponder that carry active signals, and causes these wires to be highlighted in the graphic depiction.

Example implementation 44: The method of any preceding or any subsequent example implementation, or any combination thereof, wherein the visualization tool produces the graphic depiction of the virtual satellite payload transponder from a source drawing that includes elements from a stencil library containing or referencing related operating characteristics.

Example implementation 45: The method of any preceding or any subsequent example implementation, or any combination thereof, wherein the related operating characteristics are derived from specifications or as imports or regressions of payload unit performance data. In some examples, this means execution of the executable block diagram to perform the simulation of the executed satellite payload transponder and measurement of RF signal performance utilizes the operating characteristics of the virtual payload units as derived from specifications or as imports or regressions of payload unit performance data.

Example implementation 46: The method of any preceding or any subsequent example implementation, or any combination thereof, wherein the related operating characteristics are used to control RF signal performance and obtained from the elements in the stencil library as placed into the source drawing for the graphic depiction.

Example Implementation 47: The method of any preceding or any subsequent example implementation, or any combination thereof, the method further comprises operating characteristics of the component that may be derived from specifications or as imports or regressions of payload unit performance data. These characteristics may be directly embedded within the stencil element itself, or the stencil element may contain a reference to an external source of these operating characteristics. These stencil elements are constructed such that their inputs and outputs are defined in a manner consistent with the physical element being modeled, including connector and pin identification.

Example Implementation 48: The method of any preceding or any subsequent example implementation, or any combination thereof, the method further comprises the unique configuration file for each virtual module of RF communications circuitry as referenced at initialization which may be derived from an external source of the operating characteristics as referenced by the stencil element.

Example implementation 49: A computer readable storage medium for testing a design of a satellite payload transponder with modules of RF communications circuitry including telemetry and command functionality, the computer-readable storage medium being non-transitory and having computer-readable program code portions stored therein that, in response to execution by a processor, cause an apparatus to at least execute a modeling application, via the processor configured to access a database of command inputs, for establishing a modeling environment for generating: a virtual satellite payload transponder with virtual modules of RF communications circuitry including telemetry and command functionality, with functionality equivalent to that of the satellite payload transponder with modules of RF communications circuitry including the telemetry and command functionality, where the functionality is configured according to command input from the database and includes generating a particular RF signal performance and telemetry response to a given RF waveform stimulus and configuration of the satellite payload transponder; and virtual test equipment with functionality equivalent to that of physical test equipment in conjunction with modular test system software, the virtual test equipment including virtual RF uplink and downlink signal components with functionality equivalent to that of physical test equipment RF uplink and downlink signal components, the virtual RF uplink and downlink signal components including one or more of each of: a virtual RF waveform generator with functionality equivalent to that of a physical RF waveform generator, and for generating a simulation of an RF waveform stimulus; a virtual power sensor with functionality equivalent to that of a physical power sensor, and for analyzing the generated simulation of the RF waveform stimulus; and a virtual signal analyzer with functionality equivalent to that of a physical signal analyzer, and for analyzing RF signal performance to the generated simulation of the RF waveform stimulus, wherein the modeling environment establishes an executable block diagram for performing a simulation of executed satellite payload transponder command, RF signal performance and telemetry response testing, utilizing a given version of the modular test system software corresponding to the modules of RF communications circuitry including the telemetry and command functionality of the design of the satellite payload transponder.

Example implementation 50: The computer readable storage medium of any preceding or any subsequent example implementation, or any combination thereof, wherein the virtual satellite payload transponder is built from a library of virtual modules of RF communications circuitry types architected to have a standardized modular framework with a scalable and customizable backbone of metadata representing module performance, physical module characteristics, and virtual module interfaces, the virtual models of RF communications circuitry being uploaded from the library without any modification to the virtual satellite payload transponder.

Example implementation 51: The computer readable storage medium of any preceding or any subsequent example implementation, or any combination thereof, wherein the virtual test equipment are viewed in a table of virtual test equipment types, the table including a list or table of virtual instruments and instrument information including Internet Protocol (IP) address, instrument name, cycle time, and TCP or UDP port number.

Example implementation 52: The computer readable storage medium of any preceding or any subsequent example implementation, or any combination thereof, wherein the table further provides access to a debug console for viewing communications between components of the virtual satellite payload transponder and virtual test equipment, as well as a means of providing run-time configuration of the components.

Example implementation 53: The computer readable storage medium of any preceding or any subsequent example implementation, or any combination thereof, wherein the executable block diagram defines a virtual test system that includes the virtual satellite payload transponder and the virtual test equipment, and a test executive that includes the modular test system software, and wherein the executable block diagram includes virtual Ethernet link for the virtual Ethernet layer network between the virtual test system and the test executive.

Example implementation 54: The computer readable storage medium of any preceding or any subsequent example implementation, or any combination thereof, wherein the apparatus being caused to execute the modeling application includes being caused to execute the modeling application for establishing the modeling environment for further generating a virtual Ethernet layer network for transmission of the executed satellite payload transponder command, RF signal performance and telemetry response.

Example implementation 55: The computer readable storage medium of any preceding or any subsequent example implementation, or any combination thereof, wherein the executable block diagram defines a virtual test system that includes the virtual satellite payload transponder and the virtual test equipment, and a test executive that includes the modular test system software, and wherein the executable block diagram includes virtual Ethernet link for the virtual Ethernet layer network between the virtual test system and the test executive.

Example implementation 56: The computer readable storage medium of any preceding or any subsequent example implementation, or any combination thereof, wherein the computer readable storage medium has computer-readable program code portions stored therein that, in response to execution by the processor, cause the apparatus to further execute the executable block diagram to perform the simulation of the executed satellite payload transponder command, RF signal performance and telemetry response testing to test the design of the satellite payload transponder with the modules of RF communications circuitry including the telemetry and command functionality, and to generate a test result.

Example implementation 57: The computer readable storage medium of any preceding or any subsequent example implementation, or any combination thereof, wherein the apparatus being caused to execute the executable block diagram includes being caused to execute the executable block diagram to perform the simulation utilizing operating characteristics of the virtual test equipment.

Example implementation 58: The computer readable storage medium of any preceding or any subsequent example implementation, or any combination thereof, wherein the apparatus being caused to execute the executable block diagram includes being caused to execute the executable block diagram to perform the simulation utilizing the operating characteristics that are derived from specifications of the physical test equipment.

Example implementation 59: The computer readable storage medium of any preceding or any subsequent example implementation, or any combination thereof, wherein the apparatus being caused to execute the executable block diagram includes being caused to execute the executable block diagram to perform the simulation including simulation of the virtual test equipment utilizing the operating characteristics.

Example implementation 60: The computer readable storage medium of any preceding or any subsequent example implementation, or any combination thereof, wherein the modeling environment establishes the executable block diagram including a unique configuration file for each of the virtual RF uplink and downlink signal components, and wherein the apparatus being caused to execute the executable block diagram includes initialization of the executable block diagram in which the unique configuration file is referenced.

Example implementation 61: The computer readable storage medium of any preceding or any subsequent example implementation, or any combination thereof, wherein the apparatus being caused to execute the executable block diagram to perform simulation of the executed satellite payload transponder command, RF signal performance and telemetry response testing includes being caused to generate, by the virtual modules of RF communications circuitry, a DC power consumption level output associated with the generated simulation of the RF waveform stimulus and configuration of the satellite payload transponder.

Example implementation 62: The computer readable storage medium of any preceding or any subsequent example implementation, or any combination thereof, wherein the computer readable storage medium has computer-readable program code portions stored therein that, in response to execution by the processor, cause the apparatus to further characterize the design of the satellite payload transponder based on the test result; and validate the design of the satellite payload transponder based on the characterization.

Example implementation 63: The computer readable storage medium of any preceding or any subsequent example implementation, or any combination thereof, wherein the computer readable storage medium has computer-readable program code portions stored therein that, in response to execution by the processor, and in an instance in which the design of the satellite payload transponder is validated, cause the apparatus to further identify design requirements for the satellite payload transponder based on the test result; and export the design requirements into requirement specifications for production of the satellite payload transponder with the modules of RF communications circuitry including the telemetry and command functionality according thereto.

Example implementation 64: The computer readable storage medium of any preceding or any subsequent example implementation, or any combination thereof, wherein the computer readable storage medium has computer-readable program code portions stored therein that, in response to execution by the processor, cause the apparatus to further transmit data packets to a visualization tool configured to output a graphic depiction of the virtual satellite payload transponder with the virtual modules of RF communications circuitry including the telemetry and command functionality.

Example implementation 65: The computer readable storage medium of any preceding or any subsequent example implementation, or any combination thereof, wherein the executable block diagram defines a virtual test system that includes the virtual satellite payload transponder and the virtual test equipment, and wherein the executable block diagram includes the visualization tool, and a TCP or UDP socket to connect the virtual test system to the visualization tool.

Example Implementation 66: The computer readable storage medium of any preceding or any subsequent example implementation, or any combination thereof, the computer readable storage medium further comprises executing the executable block diagram to perform the simulation of the executed satellite payload transponder and measurement of RF signal performance utilizing the operating characteristics of the virtual payload units.

Example implementation 67: The computer readable storage medium of any preceding or any subsequent example implementation, or any combination thereof, wherein the visualization tool includes a wire evaluator to examine a topology of active virtual modules of RF communications circuitry of the virtual satellite payload transponder, and determine interconnecting wires in the graphic depiction of the virtual satellite payload transponder that carry active signals, and causes these wires to be highlighted in the graphic depiction.

Example implementation 68: The computer readable storage medium of any preceding or any subsequent example implementation, or any combination thereof, wherein the visualization tool is configured to produce the graphic depiction of the virtual satellite payload transponder from a source drawing that includes elements from a stencil library containing or referencing related operating characteristics.

Example implementation 69: The computer readable storage medium of any preceding or any subsequent example implementation, or any combination thereof, wherein the related operating characteristics are derived from specifications or as imports or regressions of payload unit, performance data. In some examples, this means execution of the executable block diagram to perform the simulation of the executed satellite payload transponder and measurement of RF signal performance utilizes the operating characteristics of the virtual payload units as derived from specifications or as imports or regressions of payload unit performance data.

Example implementation 70: The computer readable storage medium of any preceding or any subsequent example implementation, or any combination thereof, wherein the related operating characteristics are used to control RF signal performance and obtained from the elements in the stencil library as placed into the source drawing for the graphic depiction.

Example Implementation 71: The computer readable storage medium of any preceding or any subsequent example implementation, or any combination thereof, the computer readable storage medium further comprises operating characteristics of the component that may be derived from specifications or as imports or regressions of payload unit performance data. These characteristics may be directly embedded within the stencil element itself, or the stencil element may contain a reference to an external source of these operating characteristics. These stencil elements are constructed such that their inputs and outputs are defined in a manner consistent with the physical element being modeled, including connector and pin identification.

Example Implementation 72: The computer readable storage medium of any preceding or any subsequent example implementation, or any combination thereof, the computer readable storage medium further comprises the unique configuration file for each virtual module of RF communications circuitry as referenced at initialization which may be derived from an external source of the operating characteristics as referenced by the stencil element.

As explained above, the present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable, unless the context of the disclosure clearly dictates otherwise.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of testing a design of a satellite payload transponder with modules of radio frequency (RF) communications circuitry including telemetry and command functionality, the method comprising:
   storing in memory a database of command inputs; and
   executing a modeling application, via a processor configured to access the database of command inputs, for establishing a modeling environment for generating:
   a virtual satellite payload transponder with virtual modules of RF communications circuitry including telemetry and command functionality, with functionality equivalent to that of the satellite payload transponder with modules of RF communications circuitry including the telemetry and command functionality, where the functionality is configured according to command input from the database and includes generating a particular RF signal performance and telemetry response to a given RF waveform stimulus and configuration of the satellite payload transponder; and
   virtual test equipment with functionality equivalent to that of physical test equipment in conjunction with modular test system software, the virtual test equipment including virtual RF uplink and downlink signal components with functionality equivalent to that of physical test equipment RF uplink and downlink signal components, the virtual RF uplink and downlink signal components including one or more of each of:
      a virtual RF waveform generator with functionality equivalent to that of a physical RF waveform generator, and for generating a simulation of an RF waveform stimulus;
      a virtual power sensor with functionality equivalent to that of a physical power sensor, and for analyzing the generated simulation of the RF waveform stimulus; and
      a virtual signal analyzer with functionality equivalent to that of a physical signal analyzer, and for analyzing RF signal performance to the generated simulation of the RF waveform stimulus,
   wherein the modeling environment establishes an executable block diagram for performing a simulation of executed satellite payload transponder command, RF signal performance and telemetry response testing, utilizing a given version of the modular test system software corresponding to the modules of RF communications circuitry including the telemetry and command functionality of the design of the satellite payload transponder, and wherein executing the modeling application includes executing the modeling application for establishing the modeling environment for further generating a virtual Ethernet link between the virtual test equipment and the modular test system software for transmission of the executed satellite payload transponder command, RF signal performance and telemetry response.

2. The method of claim 1 further comprising executing the executable block diagram to perform the simulation of the executed satellite payload transponder command, RF signal performance and telemetry response testing to test the design of the satellite payload transponder with the modules of RF communications circuitry including the telemetry and command functionality, and to generate a test result.

3. The method of claim 2, wherein executing the executable block diagram includes executing the executable block diagram to perform the simulation utilizing operating characteristics of the virtual test equipment.

4. The method of claim 2, wherein executing the executable block diagram to perform simulation of the executed satellite payload transponder command, RF signal performance and telemetry response testing includes generating, by the virtual modules of RF communications circuitry, a DC power consumption level output associated with the generated simulation of the RF waveform stimulus and configuration of the satellite payload transponder.

5. The method of claim 2 further comprising:
   characterizing the design of the satellite payload transponder based on the test result; and
   validating the design of the satellite payload transponder based on the characterization.

6. The method of claim 5, wherein in an instance in which the design of the satellite payload transponder is validated, the method further comprises:
   identifying design requirements for the satellite payload transponder based on the test result; and
   exporting the design requirements into requirement specifications for production of the satellite payload transponder with the modules of RF communications circuitry including the telemetry and command functionality according thereto.

7. The method of claim 1 further comprising transmitting data packets to a visualization tool configured to output a graphic depiction of the virtual satellite payload transponder with the virtual modules of RF communications circuitry including the telemetry and command functionality.

8. The method of claim 7, wherein the visualization tool produces the graphic depiction of the virtual satellite payload transponder from a source drawing that includes elements from a stencil library containing or referencing related operating characteristics.

9. An apparatus for testing a design of a satellite payload transponder with modules of radio frequency (RF) communications circuitry including telemetry and command functionality, the apparatus comprising a processor and a memory storing executable instructions that, in response to execution by the processor, cause the apparatus to at least:
   execute a modeling application, via the processor configured to access a database of command inputs, for establishing a modeling environment for generating:
   a virtual satellite payload transponder with virtual modules of RF communications circuitry including telemetry and command functionality, with functionality equivalent to that of the satellite payload transponder with modules of RF communications circuitry including the telemetry and command functionality, where the functionality is configured according to command input from the database and includes generating a particular RF signal performance and telemetry response to a given RF waveform stimulus and configuration of the satellite payload transponder; and virtual test equipment with functionality equivalent to that of physical test equipment in conjunction with modular test system software, the virtual test equipment including virtual RF uplink and downlink signal components with functionality equivalent to that of physical test equipment RF uplink and downlink signal components, the virtual RF uplink and downlink signal components including one or more of each of:

a virtual RF waveform generator with functionality equivalent to that of a physical RF waveform generator, and for generating a simulation of an RF waveform stimulus;

a virtual power sensor with functionality equivalent to that of a physical power sensor, and for analyzing the generated simulation of the RF waveform stimulus; and a virtual signal analyzer with functionality equivalent to that of a physical signal analyzer, and for analyzing RF signal performance to the generated simulation of the RF waveform stimulus, wherein the modeling environment establishes an executable block diagram for performing a simulation of executed satellite payload transponder command, RF signal performance and telemetry response testing, utilizing a given version of the modular test system software corresponding to the modules of RF communications circuitry including the telemetry and command functionality of the design of the satellite payload transponder, and wherein the apparatus being caused to execute the modeling application includes being caused to execute the modeling application for establishing the modeling environment for further generating a virtual Ethernet link between the virtual test equipment and the modular test system software for transmission of the executed satellite payload transponder command, RF signal performance and telemetry response.

10. The apparatus of claim 1, wherein the memory stores executable instructions that, in response to execution by the processor, cause the apparatus to further execute the executable block diagram to perform the simulation of the executed satellite payload transponder command, RF signal performance and telemetry response testing to test the design of the satellite payload transponder with the modules of RF communications circuitry including the telemetry and command functionality, and to generate a test result.

11. The apparatus of claim 10, wherein the apparatus being caused to execute the executable block diagram to perform simulation of the executed satellite payload transponder command, RF signal performance and telemetry response testing includes being caused to generate, by the virtual modules of RF communications circuitry, a DC power consumption level output associated with the generated simulation of the RF waveform stimulus and configuration of the satellite payload transponder.

12. The apparatus of claim 10, wherein the memory stores executable instructions that, in response to execution by the processor, cause the apparatus to further:

characterize the design of the satellite payload transponder based on the test result; and validate the design of the satellite payload transponder based on the characterization.

13. The apparatus of claim 12, wherein the memory stores executable instructions that, in response to execution by the processor, and in an instance in which the design of the satellite payload transponder is validated, cause the apparatus to further:

identify design requirements for the satellite payload transponder based on the test result; and export the design requirements into requirement specifications for production of the satellite payload transponder with the modules of RF communications circuitry including the telemetry and command functionality according thereto.

14. The apparatus of claim 10, wherein the apparatus being caused to execute the executable block diagram includes being caused to execute the executable block diagram to perform the simulation utilizing operating characteristics of the virtual test equipment.

15. The apparatus of claim 14, wherein the modeling environment establishes the executable block diagram including a unique configuration file for each of the virtual RF uplink and downlink signal components, and wherein the apparatus being caused to execute the executable block diagram includes initialization of the executable block diagram in which the unique configuration file is referenced.

16. The apparatus of claim 14, wherein the apparatus being caused to execute the executable block diagram includes being caused to execute the executable block diagram to perform the simulation utilizing the operating characteristics that are derived from specifications of the physical test equipment.

17. The apparatus of claim 16, wherein the apparatus being caused to execute the executable block diagram includes being caused to execute the executable block diagram to perform the simulation including simulation of the virtual test equipment utilizing the operating characteristics.

18. The apparatus of claim 9, wherein the memory stores executable instructions that, in response to execution by the processor, cause the apparatus to further transmit data packets to a visualization tool configured to output a graphic depiction of the virtual satellite payload transponder with the virtual modules of RF communications circuitry including the telemetry and command functionality.

19. The apparatus of claim 18, wherein the visualization tool is configured to produce the graphic depiction of the virtual satellite payload transponder from a source drawing that includes elements from a stencil library containing or referencing related operating characteristics.

20. The apparatus of claim 19, wherein the related operating characteristics are derived from specifications or as imports or regressions of payload unit performance data.

21. The apparatus of claim 19, wherein the related operating characteristics are used to control RF signal performance and obtained from the elements in the stencil library as placed into the source drawing for the graphic depiction.

22. A computer readable storage medium for testing a design of a satellite payload transponder with modules of radio frequency (RF) communications circuitry including telemetry and command functionality, the computer-readable storage medium being non-transitory and having computer-readable program code portions stored therein that, in response to execution by a processor, cause an apparatus to at least:

execute a modeling application, via the processor configured to access a database of command inputs, for establishing a modeling environment for generating:

a virtual satellite payload transponder with virtual modules of RF communications circuitry including telemetry and command functionality, with functionality equivalent to that of the satellite payload transponder with modules of RF communications circuitry including the telemetry and command functionality, where the functionality is configured according to command input from the database and includes generating a particular RF signal performance and telemetry response to a given RF waveform stimulus and configuration of the satellite payload transponder; and virtual test equipment with functionality equivalent to that of physical test equipment in conjunction with modular test system software, the virtual test equipment including virtual RF uplink and downlink signal components with functionality equivalent to that of physical test equipment RF uplink and downlink signal components, the virtual RF uplink and downlink signal components including one or more of each of:

a virtual RF waveform generator with functionality equivalent to that of a physical RF waveform generator, and for generating a simulation of an RF waveform stimulus;

a virtual power sensor with functionality equivalent to that of a physical power sensor, and for analyzing the generated simulation of the RF waveform stimulus; and a virtual signal analyzer with functionality equivalent to that of a physical signal analyzer, and for analyzing RF signal performance to the generated simulation of the RF waveform stimulus, wherein the modeling environment establishes an executable block diagram for performing a simulation of executed satellite payload transponder command, RF signal performance and telemetry response testing, utilizing a given version of the modular test system software corresponding to the modules of RF communications circuitry including the telemetry and command functionality of the design of the satellite payload transponder, and wherein the apparatus being caused to execute the modeling application includes being caused to execute the modeling application for establishing the modeling environment for further generating a virtual Ethernet link between the virtual test equipment and the modular test system software for transmission of the executed satellite payload transponder command, RF signal performance and telemetry response.

23. The computer readable storage medium of claim 22, wherein the computer readable storage medium has computer-readable program code portions stored therein that, in response to execution by the processor, cause the apparatus to further execute the executable block diagram to perform the simulation of the executed satellite payload transponder command, RF signal performance and telemetry response testing to test the design of the satellite payload transponder with the modules of RF communications circuitry including the telemetry and command functionality, and to generate a test result.

24. The computer readable storage medium of claim 23, wherein the apparatus being caused to execute the executable block diagram to perform simulation of the executed satellite payload transponder command, RF signal performance and telemetry response testing includes being caused to generate, by the virtual modules of RF communications circuitry, a DC power consumption level output associated with the generated simulation of the RF waveform stimulus and configuration of the satellite payload transponder.

25. The computer readable storage medium of claim 23, wherein the computer readable storage medium has computer-readable program code portions stored therein that, in response to execution by the processor, cause the apparatus to further:

characterize the design of the satellite payload transponder based on the test result; and validate the design of the satellite payload transponder based on the characterization.

26. The computer readable storage medium of claim 25, wherein the computer readable storage medium has computer-readable program code portions stored therein that, in response to execution by the processor, and in an instance in which the design of the satellite payload transponder is validated, cause the apparatus to further:

identify design requirements for the satellite payload transponder based on the test result; and export the design requirements into requirement specifications for production of the satellite payload transponder with the modules of RF communications circuitry including the telemetry and command functionality according thereto.

27. The computer readable storage medium of claim 22, wherein the computer readable storage medium has computer-readable program code portions stored therein that, in response to execution by the processor, cause the apparatus to further transmit data packets to a visualization tool configured to output a graphic depiction of the virtual satellite payload transponder with the virtual modules of RF communications circuitry including the telemetry and command functionality.

* * * * *

UNITED STATES PATENT AND TRADEMARK OFFICE
CERTIFICATE OF CORRECTION

PATENT NO. : 10,389,458 B2  
APPLICATION NO. : 15/469084  
DATED : August 20, 2019  
INVENTOR(S) : Jonathan N. Hotra et al.

Page 1 of 1

It is certified that error appears in the above-identified patent and that said Letters Patent is hereby corrected as shown below:

In the Claims

In Column 33, Claim 10, Line 47, "The apparatus of claim 1" should read -- The apparatus of claim 9 --

Signed and Sealed this  
Twelfth Day of November, 2019

Andrei Iancu  
*Director of the United States Patent and Trademark Office*